US009679324B2

(12) United States Patent
Klein

(10) Patent No.: US 9,679,324 B2
(45) Date of Patent: Jun. 13, 2017

(54) SYSTEMS AND METHODS FOR INTERACTIVE JEWELRY DESIGN

(71) Applicant: Electronic Commodities Exchange, L.P., New York, NY (US)

(72) Inventor: Moshe Klein, Monsey, NY (US)

(73) Assignee: ELECTRONIC COMMODITIES EXCHANGE, L.P., New York, NY (US)

( * ) Notice: Subject to any disclaimer, the term of this patent is extended or adjusted under 35 U.S.C. 154(b) by 374 days.

(21) Appl. No.: 13/826,517

(22) Filed: Mar. 14, 2013

(65) Prior Publication Data

US 2013/0204736 A1    Aug. 8, 2013

Related U.S. Application Data

(63) Continuation of application No. 13/248,257, filed on Sep. 29, 2011, now Pat. No. 8,626,601.

(51) Int. Cl.
*G06Q 30/06* (2012.01)
*G06F 17/50* (2006.01)

(52) U.S. Cl.
CPC ......... *G06Q 30/0621* (2013.01); *G06F 17/50* (2013.01); *G06Q 30/0613* (2013.01)

(58) Field of Classification Search
CPC ............................ G06Q 30/0621; G06F 17/50
USPC ................................................ 705/26.1, 26.5
See application file for complete search history.

(56) References Cited

U.S. PATENT DOCUMENTS 6,209,242 B1   4/2001   Marshall
6,408,647 B1   6/2002   Koll
7,631,979 B1   12/2009  Brown et al.
7,695,159 B2   4/2010   Holloway
7,962,347 B2   6/2011   Anthony-Hoppe et al.
8,626,601 B2   1/2014   Klein
9,152,991 B2   10/2015  Klein
(Continued)

FOREIGN PATENT DOCUMENTS

CN   101563713   10/2009
JP   2002-099790   4/2002
JP   2002-324106   11/2006

OTHER PUBLICATIONS

Notification of Transmittal of the International Search Report and the Written Opinion of the International Searching Authority, or the Declaration for International Application No. PCT/US12/58141 dated Feb. 22, 2013 (17 pages).

(Continued)

*Primary Examiner* — Mila Airapetian
(74) *Attorney, Agent, or Firm* — Thomas D. Bradshaw

(57) ABSTRACT

Methods and systems for designing a customized jewelry item on-line. Some embodiments include generating an interactive design tool. The interactive design tool comprises an electronic template of the customized setting and the customized setting comprises a plurality of sections. User-input data is received, in which the user-input data comprises selection of a section of the customized setting; and a selection of at least one customizable feature of the selected section. A graphical representation of the customized setting is generated, in which the customized setting comprises the at least one customizable feature. The graphical representation of the customized setting is displayed on a display.

23 Claims, 17 Drawing Sheets

(56) References Cited

U.S. PATENT DOCUMENTS

| | | | |
|---|---|---|---|
| 2005/0222862 A1* | 10/2005 | Guhde | G06Q 30/0601 |
| | | | 705/26.1 |
| 2005/0261980 A1* | 11/2005 | Hadi | G06Q 30/06 |
| | | | 705/26.43 |
| 2005/0261989 A1 | 11/2005 | Vadon et al. | |
| 2006/0206416 A1 | 9/2006 | Farias | |
| 2007/0132845 A1 | 6/2007 | Gottesman | |
| 2008/0313552 A1* | 12/2008 | Buehler | G06Q 10/10 |
| | | | 715/760 |
| 2009/0144174 A1 | 6/2009 | Reddy | |
| 2009/0229308 A1 | 9/2009 | Mehta | |
| 2009/0248591 A1 | 10/2009 | Feldman et al. | |
| 2009/0300526 A1 | 12/2009 | Port | |
| 2010/0030578 A1 | 2/2010 | Siddique et al. | |
| 2010/0205568 A1 | 8/2010 | Mooney et al. | |
| 2010/0268669 A1 | 10/2010 | Anthony-Hoppe et al. | |
| 2010/0324980 A1 | 12/2010 | Schantz | |
| 2011/0004524 A1 | 1/2011 | Paul | |
| 2011/0239255 A1* | 9/2011 | Hecht et al. | 725/60 |
| 2011/0307349 A1 | 12/2011 | Gandhi et al. | |
| 2011/0313878 A1 | 12/2011 | Norman | |
| 2012/0016772 A1 | 1/2012 | Sadagopan et al. | |
| 2012/0234043 A1 | 9/2012 | Guerrero, II | |
| 2012/0304129 A1 | 11/2012 | De Francesco | |
| 2012/0331422 A1* | 12/2012 | High | G06Q 50/00 |
| | | | 715/849 |
| 2013/0191507 A1 | 7/2013 | Tuukkanen | |
| 2013/0208085 A1 | 8/2013 | Marion et al. | |
| 2013/0218714 A1 | 8/2013 | Watkins et al. | |
| 2013/0226646 A1 | 8/2013 | Watkins et al. | |
| 2013/0325627 A1 | 12/2013 | Kimmerling | |
| 2014/0052563 A1 | 2/2014 | Watkins et al. | |
| 2014/0078399 A1 | 3/2014 | Frouin | |

OTHER PUBLICATIONS

CarMax Business Services, LLC, www.carmax.com (2010-Apr. 8, 2011).

Notification of Transmittal of the International Search Report and the Written Opinion of the International Searching Authority, or the Declaration for International Application No. PCT/US14/15010 dated May 22, 2014 (8 pages).

USPTO Office Action for U.S. Appl. No. 13/248,257 mailed Jan. 23, 2013 (12 pages).

USPTO Notice of Allowance and Fees Due for U.S. Appl. No. 13/248,257 mailed Aug. 27, 2013 (9 pages).

JP Office Action for Application No. 2014-533444; Oct. 4, 2016 (14 pages w/English Translations).

Chinese Office Action for Application No. 201280058672.7; Nov. 1, 2016 (42 pages w/English Translations).

* cited by examiner

FIGURE 4b

SYSTEMS AND METHODS FOR INTERACTIVE JEWELRY DESIGN

CROSS REFERENCE TO RELATED APPLICATIONS

This application is a continuation of U.S. application Ser. No. 13/248,257, filed on Sep. 29, 2011, which is incorporated by reference herein.

FIELD OF THE INVENTION

This application is generally related to systems and methods for designing a customized jewelry item.

BRIEF DESCRIPTION OF THE FIGURES

FIG. 4b is a screen shot of the search results, after the user action of comparing.

DETAILED DESCRIPTION

Figure 1:
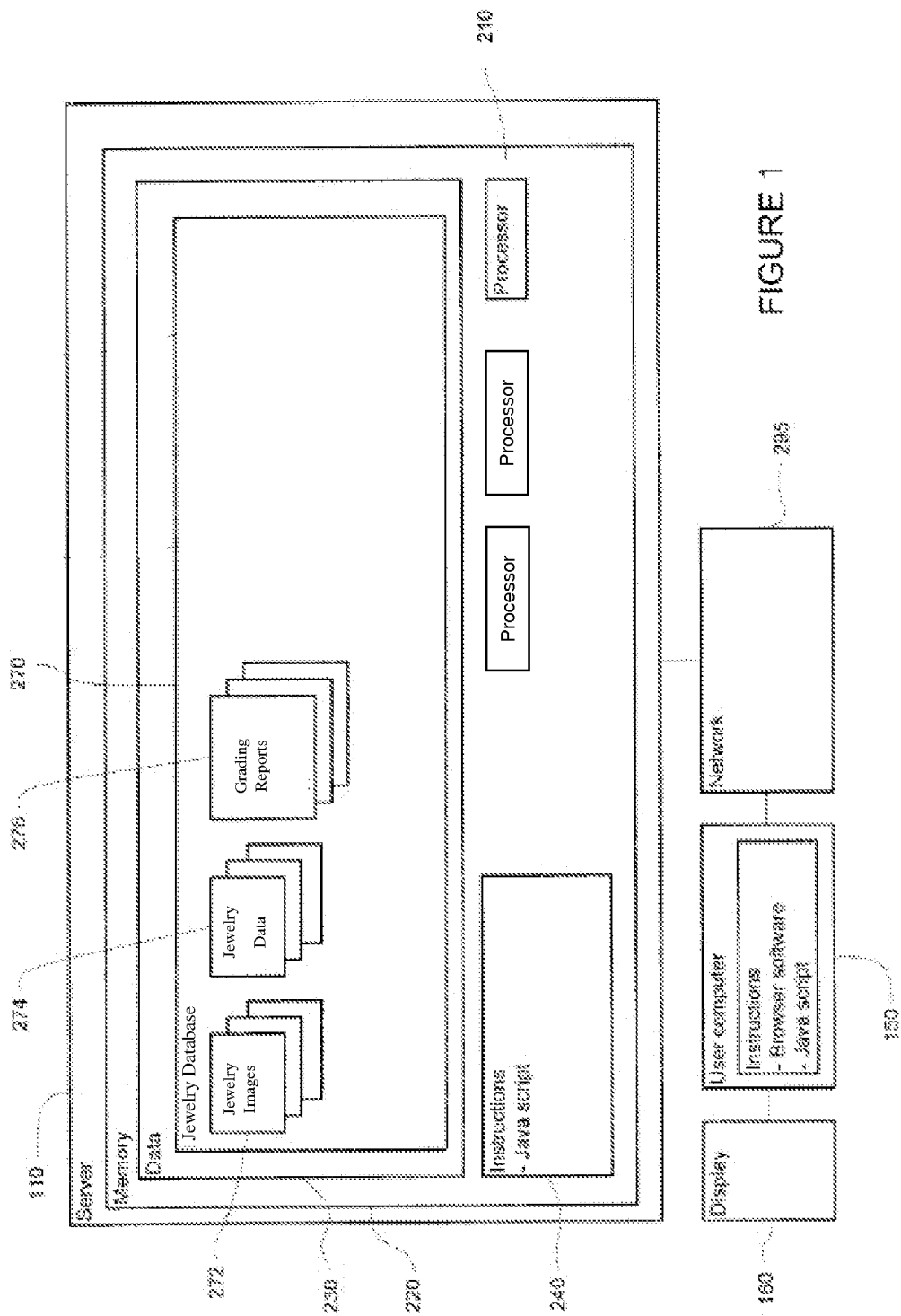
FIG. 1 is a block diagram of a system in accordance with an aspect of the invention.

The following sections I-XI provide a guide to interpreting the present application.

I. Terms

The term "product" means any machine, manufacture and/or composition of matter, unless expressly specified otherwise.

The term "product" means a machine, manufacture and/or composition of matter, unless expressly specified otherwise.

The term "process" means a process, algorithm, method or the like, unless expressly specified otherwise.

Each process (whether called a method, algorithm or otherwise) inherently includes one or more steps, and therefore all references to a "step" or "steps" of a process have an inherent antecedent basis in the mere description of a process, or in the mere recitation of the term 'process' or a like term. Accordingly, any reference in a claim to a 'step' or 'steps' of a process has sufficient antecedent basis.

The term "invention" and the like mean "the one or more inventions disclosed in this application", unless expressly specified otherwise.

The terms "an embodiment", "embodiment", "embodiments", "the embodiment", "the embodiments", "one or more embodiments", "some embodiments", "certain embodiments", "one embodiment", "another embodiment" and the like mean "one or more (but not all) embodiments of the invention", unless expressly specified otherwise.

The term "variation" of an invention means an embodiment of the invention, unless expressly specified otherwise.

The term "indication" is used in an extremely broad sense. An "indication" of a thing should be understood to include anything that may be used to determine the thing.

An indication of a thing may include an electronic message that identifies the thing (e.g., an identification of a widget by a serial number affixed to the widget, an identification of a widget by one or more characteristics of the widget). An indication of a thing may include information that may be used to compute and/or look-up a thing (e.g., information identifying a machine of which a widget is a part that may be used to determine the widget). An indication of a thing may specify things that are related to the thing (e.g., characteristics of the thing, a name of the thing, a name of a thing related to the thing). An indication of a thing may not specify things that are related to the thing (e.g., a letter "a" may be an indication of a widget of a computer system that is configured to interpret the letter "a" to identify the widget). An indication of a thing may include a sign, a symptom, and/or a token of the thing. An indication, for example, may include a code, a reference, an example, a link, a signal, and/or an identifier. An indication of a thing may include information that represents, describes, and/or otherwise is associated with the thing.

A transformation of an indication of a thing may be an indication of the thing (e.g., an encrypted indication of a thing may be an indication of the thing). An indication of a thing may include the thing itself, a copy of the thing, and/or a portion of the thing. An indication of a thing may be meaningless to a thing that is not configured to understand the indication (e.g., a person may not understand that a letter "a" indicates a widget but it may nonetheless be an indication of the widget because the computer system may determine the widget from the letter "a"). It should be understood that the fact that an indication of a thing may be used to determine the thing does not mean that the thing or anything else is determined. An indication of a thing may include an indication of any number of the thing unless specified otherwise. An indication of a thing may include an indication of other things (e.g., an electronic message that indicates may things). (Indication can be used as a very broad term in claim language. For example: receiving an indication of a financial instrument.)

The term "represent" means (1) to serve to express, designate, stand for, or denote, as a word, symbol, or the like does; (2) to express or designate by some term, character, symbol, or the like; (3) to portray or depict or present the likeness of, as a picture does; or (4) to serve as a sign or symbol of.

A reference to "another embodiment" in describing an embodiment does not imply that the referenced embodiment is mutually exclusive with another embodiment (e.g., an embodiment described before the referenced embodiment), unless expressly specified otherwise. Similarly, the mere fact that two (or more) embodiments are referenced does not imply that those embodiments are mutually exclusive.

One embodiment of the invention may include or cover or embrace more than one other embodiment of the invention. For example, a first embodiment comprising elements a, b, and c may cover a second embodiment that comprises elements a, b, c, and d as well as a third embodiment covering elements a, b, c, and e. Similarly, each of the first, second, and third embodiments may cover a fourth embodiment comprising elements a, b, c, d, and e.

The terms "including", "comprising" and variations thereof mean "including but not necessarily limited to", unless expressly specified otherwise. Thus, for example, the sentence "the machine includes a red widget and a blue widget" means the machine includes the red widget and the blue widget, but may possibly include one or more other items as well.

The term "consisting of" and variations thereof mean "including and also limited to", unless expressly specified otherwise. Thus, for example, the sentence "the machine consists of a red widget and a blue widget" means the machine includes the red widget and the blue widget, but does not include anything else.

The term "compose" and variations thereof mean "to make up the constituent parts of, component of or member of", unless expressly specified otherwise. Thus, for example, the sentence "the red widget and the blue widget compose a machine" means the machine includes the red widget and the blue widget.

The term "exclusively compose" and variations thereof mean "to make up exclusively the constituent parts of, to be the only components of, or to be the only members of", unless expressly specified otherwise. Thus, for example, the sentence "the red widget and the blue widget exclusively compose a machine" means the machine consists of the red widget and the blue widget (i.e. and nothing else).

The terms "a", "an" and "the" refer to "one or more", unless expressly specified otherwise. Thus, for example, the phrase "a widget" means one or more widgets, unless expressly specified otherwise. Similarly, after reciting the phrase "a widget", a subsequent recitation of the phrase "the widget" means "the one or more widgets". Accordingly, it should be understood that the word "the" may also refer to a specific term having antecedent basis. For example, if a paragraph mentions "a specific single feature" and then refers to "the feature," then the phrase "the feature" should be understood to refer to the previously mentioned "a specific single feature." (It should be understood that the term "a" in "a specific single feature" refers to "one" specific single feature and not "one or more" specific single features.)

The term "plurality" means "two or more", unless expressly specified otherwise.

The term "herein" means "in the present application, including anything which may be incorporated by reference", unless expressly specified otherwise.

The phrase "at least one of", when such phrase modifies a plurality of things (such as an enumerated list of things), means any combination of one or more of those things, unless expressly specified otherwise. For example, the phrase "at least one of a widget, a car and a wheel" means either (i) a widget, (ii) a car, (iii) a wheel, (iv) a widget and a car, (v) a widget and a wheel, (vi) a car and a wheel, or (vii) a widget, a car and a wheel. The phrase "at least one of", when such phrase modifies a plurality of things does not mean "one of each of" the plurality of things. For example, the phrase "at least one of a widget, a car and a wheel" does not mean "one widget, one car and one wheel".

Numerical terms such as "one", "two", etc. when used as cardinal numbers to indicate quantity of something (e.g., one widget, two widgets), mean the quantity indicated by that numerical term, but do not mean at least the quantity indicated by that numerical term. For example, the phrase "one widget" does not mean "at least one widget", and therefore the phrase "one widget" does not cover, e.g., two widgets.

The phrase "based on" does not mean "based only on", unless expressly specified otherwise. In other words, the phrase "based on" covers both "based only on" and "based at least on". The phrase "based at least on" is equivalent to the phrase "based at least in part on". For example, the phrase "element A is calculated based on element B and element C" covers embodiments where element A is calculated as the product of B times C (in other words, A=B×C), embodiments where A is calculated as the sum of B plus C (in other words, A=B+C), embodiments where A is calculated as a product of B times C times D, embodiments where A is calculated as a sum of the square root of B plus C plus D times E, and so on.

The term "represent" and like terms are not exclusive, unless expressly specified otherwise. For example, the term "represents" does not mean "represents only", unless expressly specified otherwise. For example, the phrase "the data represents a credit card number" covers both "the data represents only a credit card number" and "the data represents a credit card number and the data also represents something else".

The term "whereby" is used herein only to precede a clause or other set of words that express only the intended result, objective or consequence of something that is explicitly recited before the term "whereby". Thus, when the term "whereby" is used in a claim, the clause or other words that the term "whereby" modifies do not establish specific further limitations of the claim or otherwise restrict the meaning or scope of the claim.

The terms "e.g", "such as" and like terms mean "for example", and thus do not limit the term or phrase they explain. For example, in the sentence "the computer sends data (e.g., instructions, a data structure) over the Internet", the term "e.g." explains that "instructions" are an example of "data" that the computer may send over the Internet, and also explains that "a data structure" is an example of "data" that the computer may send over the Internet. However, both "instructions" and "a data structure" are merely examples of "data", and other things besides "instructions" and "a data structure" can be "data".

The term "respective" and like terms mean "taken individually". Thus if two or more things have "respective" characteristics, then each such thing has its own characteristic, and these characteristics can be different from each other but need not be. For example, the phrase "each of two machines has a respective function" means that the first of the two machines has a function and the second of the two machines has a function as well. The function of the first machine may or may not be the same as the function of the second machine.

The term "i.e." and like terms mean "that is", and thus limits the term or phrase it explains. For example, in the sentence "the computer sends data (i.e., instructions) over the Internet", the term "i.e." explains that "instructions" are the "data" that the computer sends over the Internet.

A numerical range includes integers and non-integers in the range, unless expressly specified otherwise. For example, the range "1 to 10" includes the integers from 1 to 10 (e.g., 1, 2, 3, 4, . . . 9, 10) and non-integers (e.g., 1.0031415926, 1.1, 1.2, . . . 1.9).

Where two or more terms or phrases are synonymous (e.g., because of an explicit statement that the terms or phrases are synonymous), instances of one such term or phrase does not mean instances of another such term or phrase must have a different meaning. For example, where a statement renders the meaning of "including" to be synonymous with "including but not limited to", the mere usage of the phrase "including but not limited to" does not mean that the term "including" means something other than "including but not limited to".

II. Determining

The term "determining" and grammatical variants thereof (e.g., to determine a price, determining a value, the determination of an object which meets a certain criterion) is used in an extremely broad sense. The term "determining" encompasses a wide variety of actions and therefore "determining" can include calculating, computing, processing, deriving, investigating, looking up (e.g., looking up in a table, a database or another data structure), rendering into electronic format or digital representation, ascertaining and the like. Also, "determining" can include receiving (e.g., receiving information), accessing (e.g., accessing data in a memory) and the like. Also, "determining" can include resolving, selecting, choosing, establishing, and the like.

The term "determining" does not imply certainty or absolute precision, and therefore "determining" can include estimating, extrapolating, predicting, guessing, averaging and the like.

The term "determining" does not imply that mathematical processing must be performed, and does not imply that numerical methods must be used, and does not imply that an algorithm is used.

The term "determining" does not imply that any particular device must be used. For example, a computer need not necessarily perform the determining.

The term "determining" may include "calculating". The term "calculating" should be understood to include performing one or more calculations. Calculating may include computing, processing, and/or deriving. Calculating may be performed by a computing device. For example, calculating a thing may include applying an algorithm to data by a computer processor and generating the thing as an output of the processor.

The term "determining" may include "referencing". The term "referencing" should be understood to include making one or more reference, e.g., to a thing. Referencing may include querying, accessing, selecting, choosing, reading, and/or looking-up. The act of referencing may be performed by a computing device. For example, referencing a thing may include reading a memory location in which the thing is stored by a processor.

The term "determining" may include "receiving". For example, receiving a thing may include taking in the thing. In some embodiments, receiving may include acts performed to take in a thing, such as operating a network interface through which the thing is taken in. In some embodiments, receiving may be performed without acts performed to take in the thing, such as in a direct memory write or a hard wired circuit. Receiving a thing may include receiving a thing from a remote source that may have calculated the thing.

III. Forms of Sentences

Where a limitation of a first claim would cover one of a feature as well as more than one of a feature (e.g., a limitation such as "at least one widget" covers one widget as well as more than one widget), and where in a second claim that depends on the first claim, the second claim uses a definite article "the" to refer to that limitation (e.g., "the widget"), this mere usage does not imply that the first claim covers only one of the feature, and this does not imply that the second claim covers only one of the feature (e.g., "the widget" can cover both one widget and more than one widget).

When an ordinal number (such as "first", "second", "third" and so on) is used as an adjective before a term, that ordinal number is used (unless expressly specified otherwise) merely to indicate a particular feature, such as to distinguish that particular feature from another feature that is described by the same term or by a similar term, but that ordinal number does not have any other meaning or limiting effect—it is merely a convenient name. For example, a "first widget" may be so named merely to distinguish it from, e.g., a "second widget". Thus, the mere usage of the ordinal numbers "first" and "second" before the term "widget" does not indicate any other relationship between the two widgets, and likewise does not indicate any other characteristics of either or both widgets. For example, the mere usage of the ordinal numbers "first" and "second" before the term "widget" (1) does not indicate that either widget comes before or after any other in order or location; (2) does not indicate that either widget occurs or acts before or after any other in time; and (3) does not indicate that either widget ranks above or below any other, as in importance or quality. The mere usage of ordinal numbers does not define a numerical limit to the features identified with the ordinal numbers. For example, the mere usage of the ordinal numbers "first" and "second" before the term "widget" does not indicate that there are exactly two widgets.

When a single device, article or other product is described herein, in another embodiment more than one device or article (whether or not they cooperate) may alternatively be used in place of the single device or article that is described. Accordingly, the functionality that is described as being possessed by a device may alternatively be possessed by more than one device or article (whether or not they cooperate) in another embodiment.

Similarly, where more than one device, article or other product is described herein (whether or not they cooperate), in another embodiment a single device or article may alternatively be used in place of the more than one device or article that is described. For example, a plurality of computer-based devices may be substituted with a single computer-based device. In some embodiments, such a plurality of computer-based devices may operate together to perform one step of a process such as is common in grid computing systems. In some embodiments, such a plurality of computer-based devices may operate provide added functionality to one another so that the plurality may operate to perform one step of a process such as is common in cloud computing systems. (Conversely, a single computer-based device may be substituted with multiple computer-based devices operating in cooperation with one another. For example, a single computing device may be substituted with a server and a workstation in communication with one another over the internet). Accordingly, the various functionality that is described as being possessed by more than one device or article may alternatively be possessed by a single device or article.

The functionality and/or the features of a single device that is described may, in another embodiment, be alternatively embodied by one or more other devices which are described but are not explicitly described as having such functionality or features. Thus, other embodiments need not include the described device itself, but rather can include the one or more other devices which would, in those other embodiments, have such functionality or features.

IV. Disclosed Examples and Terminology are not Limiting

Neither the Title (set forth at the beginning of the first page of the present application) nor the Abstract (set forth at the end of the present application) is to be taken as limiting in any way the scope of the disclosed invention, is to be used in interpreting the meaning of any claim or is to be used in limiting the scope of any claim. An Abstract has been included in this application merely because an Abstract is required under 37 C.F.R. §1.72(b).

The headings of sections provided in the present application are for convenience only, and are not to be taken as limiting the disclosure in any way.

Numerous embodiments are described in the present application, and are presented for illustrative purposes only. The described embodiments are not, and are not intended to be, limiting in any sense. The disclosed invention is widely applicable to numerous embodiments, as is readily apparent from the disclosure. One of ordinary skill in the art will recognize that the disclosed invention may be practiced with various modifications and alterations, such as structural, logical, software, and electrical modifications. Although particular features of the disclosed invention may be described with reference to one or more particular embodiments and/or drawings, it should be understood that such features are not limited to usage in the one or more particular embodiments or drawings with reference to which they are described, unless expressly specified otherwise.

Though an embodiment may be disclosed as including several features, other embodiments of the invention may include fewer than all such features. Thus, for example, a claim may be directed to less than the entire set of features in a disclosed embodiment, and such claim would not be interpreted as requiring features beyond those features that the claim expressly recites.

No embodiment of method steps or product elements described in the present application constitutes the invention claimed herein, or is essential to the invention claimed herein, or is coextensive with the invention claimed herein, except where it is either expressly stated to be so in this specification or (with respect to a claim and the invention defined by that claim) expressly recited in that claim.

Any preambles of the claims that recite anything other than a statutory class shall be interpreted to recite purposes, benefits and possible uses of the claimed invention, and such preambles shall not be construed to limit the claimed invention.

The present disclosure is not a literal description of all embodiments of the invention. Also, the present disclosure is not a listing of features of the invention which must be present in all embodiments.

All disclosed embodiments are not necessarily covered by the claims (even including all pending, amended, issued and canceled claims). In addition, a disclosed embodiment may be (but need not necessarily be) covered by several claims. Accordingly, where a claim (regardless of whether pending, amended, issued or canceled) is directed to a particular embodiment, such is not evidence that the scope of other claims do not also cover that embodiment.

Devices that are described as in communication with each other need not be in continuous communication with each other, unless expressly specified otherwise. On the contrary, such devices need only transmit to each other as necessary or desirable, and may actually refrain from exchanging data most of the time. For example, a machine in communication with another machine via the Internet may not transmit data to the other machine for long period of time (e.g. weeks at a time). In addition, devices that are in communication with each other may communicate directly or indirectly through one or more intermediaries. Devices are in communication with one another if they are capable of at least one-way communication with one another. For example, a first device is in communication with a second device if the first device is capable of transmitting information to the second device. Similarly, the second device is in communication with the first device if the second device is capable of receiving information from the first device.

A description of an embodiment with several components or features does not imply that all or even any of such components or features are required. On the contrary, a variety of optional components are described to illustrate the wide variety of possible embodiments of the present invention. Unless otherwise specified explicitly, no component or feature is essential or required.

Although process steps, algorithms or the like may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred.

Although a process may be described as including a plurality of steps, that does not imply that all or any of the steps are preferred, essential or required. Various other embodiments within the scope of the described invention include other processes that omit some or all of the described steps. Unless otherwise specified explicitly, no step is essential or required.

Although a process may be described singly or without reference to other products or methods, in an embodiment the process may interact with other products or methods. For example, such interaction may include linking one business model to another business model. Such interaction may be provided to enhance the flexibility or desirability of the process.

Although a product may be described as including a plurality of components, aspects, qualities, characteristics and/or features, that does not indicate that any or all of the plurality are preferred, essential or required. Various other embodiments within the scope of the described invention include other products that omit some or all of the described plurality.

An enumerated list of items (which may or may not be numbered) does not imply that any or all of the items are mutually exclusive, unless expressly specified otherwise. Likewise, an enumerated list of items (which may or may not be numbered) does not imply that any or all of the items are comprehensive of any category, unless expressly specified otherwise. For example, the enumerated list "a computer, a laptop, and a PDA" does not imply that any or all of the three items of that list are mutually exclusive and does not imply that any or all of the three items of that list are comprehensive of any category.

An enumerated list of items (which may or may not be numbered) does not imply that any or all of the items are equivalent to each other or readily substituted for each other.

All embodiments are illustrative, and do not imply that the invention or any embodiments were made or performed, as the case may be.

V. Computing

It will be readily apparent to one of ordinary skill in the art that the various processes described herein may be implemented by, e.g., appropriately programmed general purpose computers, special purpose computers and computing devices. Typically a processor (e.g., one or more microprocessors, one or more microcontrollers, one or more digital signal processors) will receive instructions (e.g., from a memory or like device), and execute those instructions, thereby performing one or more processes defined by those instructions. Instructions may be embodied in, e.g., one or more computer programs, one or more scripts.

The term "compute" shall mean to determine using a processor in accordance with a software algorithm.

A "processor" means one or more microprocessors, central processing units (CPUs), computing devices, microcontrollers, digital signal processors, graphics processing units (GPUs) or like devices or any combination thereof, regardless of the architecture (e.g., chip-level multiprocessing or multi-core, RISC, CISC, Microprocessor without Interlocked Pipeline Stages, pipelining configuration, simultaneous multithreading, microprocessor with integrated graphics processing unit, GPGPU).

A "computing device" means one or more microprocessors, central processing units (CPUs), computing devices, microcontrollers, digital signal processors, graphics card, mobile gaming device, or like devices or any combination thereof, regardless of the architecture (e.g., chip-level multiprocessing or multi-core, RISC, CISC, Microprocessor without Interlocked Pipeline Stages, pipelining configuration, simultaneous multithreading).

Thus a description of a process is likewise a description of an apparatus for performing the process. The apparatus that performs the process can include, e.g., a processor and those input devices and output devices that are appropriate to perform the process. For example, a description of a process is a description of an apparatus comprising a processor and memory that stores a program comprising instructions that, when executed by the processor, direct the processor to perform the method.

The apparatus that performs the process can include a plurality of computing devices that work together to perform the process. Some of the computing devices may work together to perform each step of a process, may work on separate steps of a process, may provide underlying services that other computing devices that may facilitate the performance of the process. Such computing devices may act under instruction of a centralized authority. In another embodiment, such computing devices may act without instruction of a centralized authority. Some examples of apparatus that may operate in some or all of these ways may include grid computer systems, cloud computer systems, peer-to-peer computer systems, computer systems configured to provide software as a service, and so on. For example, the apparatus may comprise a computer system that executes the bulk of its processing load on a remote server but outputs display information to and receives user input information from a local user computer, such as a computer system that executes VMware software.

Further, programs that implement such methods (as well as other types of data) may be stored and transmitted using a variety of media (e.g., computer readable media) in a number of manners. In some embodiments, hard-wired circuitry or custom hardware may be used in place of, or in combination with, some or all of the software instructions that can implement the processes of various embodiments. Thus, various combinations of hardware and software may be used instead of software only.

The term "computer-readable medium" refers to any medium, a plurality of the same, or a combination of different media, that participate in providing data (e.g., instructions, data structures) which may be read by a computer, a processor or a like device. Such a medium may take many forms, including but not limited to, non-volatile media, volatile media, and transmission media. Non-volatile media include, for example, optical or magnetic disks and other persistent memory. Volatile media include dynamic random access memory (DRAM), which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

The term "tangible computer-readable medium" refers to a "computer-readable medium" that comprises a hardware component, such as optical or magnetic disks.

Various forms of computer readable media may be involved in carrying data (e.g. sequences of instructions) to a processor. For example, data may be (i) delivered from RAM to a processor; (ii) carried over a wireless transmission medium; (iii) formatted and/or transmitted according to numerous formats, standards or protocols, such as Ethernet (or IEEE 802.3), wireless local area network communication defined by the IEEE 802.11 specifications whether or not they are approved by the WiFi Alliance, SAP, ATP, Bluetooth™, and TCP/IP, TDMA, CDMA, and 3G; and/or (iv) encrypted to ensure privacy or prevent fraud in any of a variety of ways well known in the art.

The term "database" refers to any electronically-stored collection of data that is stored in a retrievable format.

The term "data structure" refers to a database in a hardware machine such as a computer.

The term "network" means a series of points or nodes interconnected by communication paths. For example, a network can include a plurality of computers or communication devices interconnected by one or more wired and/or wireless communication paths. Networks can interconnect with other networks and contain subnetworks.

The term "predetermined" means determined beforehand, e.g., before a present time or a present action. For example, the phrase "displaying a predetermined value" means displaying a value that was determined before the act of displaying.

The term "condition" means (1) a premise upon which the fulfillment of an agreement depends, or (2) something essential to the appearance or occurrence of something else.

The term "transaction" means (1) an exchange or transfer of goods, services, or funds, or (2) a communicative action or activity involving two parties or things that reciprocally affect or influence each other.

Thus a description of a process is likewise a description of a computer-readable medium storing a program for performing the process. The computer-readable medium can store (in any appropriate format) those program elements which are appropriate to perform the method. For example, a description of a process is a description of a computer-readable storage medium that stores a program comprising instructions that, when executed by a processor, direct the processor to perform the method.

Just as the description of various steps in a process does not indicate that all the described steps are required, embodiments of an apparatus include a computer or computing device operable to perform some (but not necessarily all) of the described process.

Likewise, just as the description of various steps in a process does not indicate that all the described steps are required, embodiments of a computer-readable medium storing a program or data structure include a computer-readable medium storing a program that, when executed, can cause a processor to perform some (but not necessarily all) of the described process.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) could be used to store and manipulate the data types described herein. Likewise, object methods or behaviors of a database can be used to implement various processes, such as the described herein. In addition, the databases may, in a known manner, be stored locally or remotely from a device which accesses data in such a database.

Various embodiments can be configured to work in a network environment including a computer that is in communication (e.g., via a communications network) with one or more devices. The computer may communicate with the devices directly or indirectly, via any wired or wireless medium (e.g. the Internet, LAN, WAN or Ethernet, Token Ring, a telephone line, a cable line, a radio channel, an optical communications line, commercial on-line service providers, bulletin board systems, a satellite communications link, a combination of any of the above). Each of the devices may themselves comprise computers or other computing devices, such as those based on the Intel®, Pentium®, or Centrino™, Atom™ or Core™ processor, that are adapted to communicate with the computer. Any number and type of devices may be in communication with the computer.

In an embodiment, a server computer or centralized authority may not be necessary or desirable. For example, the present invention may, in an embodiment, be practiced on one or more devices without a central authority. In such an embodiment, any functions described herein as performed by the server computer or data described as stored on the server computer may instead be performed by or stored on one or more such devices.

Where a process is described, in an embodiment the process may operate without any user intervention. In another embodiment, the process includes some human intervention (e.g., a step is performed by or with the assistance of a human).

As used herein, the term "encryption" refers to a process for obscuring or hiding information so that the information is not readily understandable without special knowledge. The process of encryption may transform raw information, called plaintext, into encrypted information. The encrypted information may be called ciphertext, and the algorithm for transforming the plaintext into ciphertext may be referred to as a cipher. A cipher may also be used for performing the reverse operation of converting the ciphertext back into plaintext. Examples of ciphers include substitution ciphers, transposition ciphers, and ciphers implemented using rotor machines.

In various encryption methods, ciphers may require a supplementary piece of information called a key. A key may consist, for example, of a string of bits. A key may be used in conjunction with a cipher to encrypt plaintext. A key may also be used in conjunction with a cipher to decrypt ciphertext. In a category of ciphers called symmetric key algorithms (e.g., private-key cryptography), the same key is used for both encryption and decryption. The sanctity of the encrypted information may thus depend on the key being kept secret. Examples of symmetric key algorithms are DES and AES. In a category of ciphers called asymmetric key algorithms (e.g., public-key cryptography), different keys are used for encryption and decryption. With an asymmetric key algorithm, any member of the public may use a first key (e.g., a public key) to encrypt plaintext into ciphertext. However, only the holder of a second key (e.g., the private key) will be able to decrypt the ciphertext back in to plaintext. An example of an asymmetric key algorithm is the RSA algorithm.

VI. Continuing Applications

The present disclosure provides, to one of ordinary skill in the art, an enabling description of several embodiments and/or inventions. Some of these embodiments and/or inventions may not be claimed in the present application, but may nevertheless be claimed in one or more continuing applications that claim the benefit of priority of the present application.

Applicants intend to file additional applications to pursue patents for subject matter that has been disclosed and enabled but not claimed in the present application.

VII. 35 U.S.C. §112, Paragraph 6

In a claim, a limitation of the claim which includes the phrase "means for" or the phrase "step for" means that 35 U.S.C. §112, paragraph 6, applies to that limitation.

In a claim, a limitation of the claim which does not include the phrase "means for" or the phrase "step for" means that 35 U.S.C. §112, paragraph 6 does not apply to that limitation, regardless of whether that limitation recites a function without recitation of structure, material or acts for performing that function. For example, in a claim, the mere use of the phrase "step of" or the phrase "steps of" in referring to one or more steps of the claim or of another claim does not mean that 35 U.S.C. §112, paragraph 6, applies to that step(s).

With respect to a means or a step for performing a specified function in accordance with 35 U.S.C. §112, paragraph 6, the corresponding structure, material or acts described in the specification, and equivalents thereof, may perform additional functions as well as the specified function.

Computers, processors, computing devices and like products are structures that can perform a wide variety of functions. Such products can be operable to perform a specified function by executing one or more programs, such as a program stored in a memory device of that product or in a memory device which that product accesses. Unless expressly specified otherwise, such a program need not be based on any particular algorithm, such as any particular algorithm that might be disclosed in the present application. It is well known to one of ordinary skill in the art that a specified function may be implemented via different algorithms, and any of a number of different algorithms would be a mere design choice for carrying out the specified function.

Therefore, with respect to a means or a step for performing a specified function in accordance with 35 U.S.C. §112, paragraph 6, structure corresponding to a specified function includes any product programmed to perform the specified function. Such structure includes programmed products which perform the function, regardless of whether such product is programmed with (i) a disclosed algorithm for performing the function, (ii) an algorithm that is similar to a disclosed algorithm, or (iii) a different algorithm for performing the function.

Where there is recited a means for performing a function that is a method, one structure for performing this method includes a computing device (e.g., a general purpose computer) that is programmed and/or configured with appropriate hardware to perform that function.

Also included is a computing device (e.g., a general purpose computer) that is programmed and/or configured with appropriate hardware to perform that function via other algorithms as would be understood by one of ordinary skill in the art.

VIII. Disclaimer

Numerous references to a particular embodiment do not indicate a disclaimer or disavowal of additional, different embodiments, and similarly references to the description of embodiments which all include a particular feature do not indicate a disclaimer or disavowal of embodiments which do not include that particular feature. A clear disclaimer or disavowal in the present application will be prefaced by the phrase "does not include" or by the phrase "cannot perform".

IX. Incorporation By Reference

Any patent, patent application or other document referred to herein is incorporated by reference into this patent application as part of the present disclosure, but only for purposes of written description and enablement in accordance with 35 U.S.C. §112, paragraph 1, and should in no way be used to limit, define, or otherwise construe any term of the present application, unless without such incorporation by reference, no ordinary meaning would have been ascertainable by a person of ordinary skill in the art. Such person of ordinary skill in the art need not have been in any way limited by any embodiments provided in the reference. Conversely, the definitions provided in this application should not be used to limit, define, or otherwise construe any term of any document incorporated herein by reference. The definitions set forth explicitly in this application are controlling notwithstanding the description of particular embodiments that may be incompatible with the definition(s).

Any incorporation by reference does not, in and of itself, imply any endorsement of, ratification of or acquiescence in any statements, opinions, arguments or characterizations contained in any incorporated patent, patent application or other document, unless explicitly specified otherwise in this patent application.

X. Prosecution History

In interpreting the present application (which includes the claims), one of ordinary skill in the art shall refer to the prosecution history of the present application, but not to the prosecution history of any other patent or patent application, regardless of whether there are other patent applications that are considered related to the present application, and regardless of whether there are other patent applications that share a claim of priority with the present application.

XI. Alternative Technologies

It will be understood that the technologies described herein for making, using, or practicing various embodiments are but a subset of the possible technologies that may be used for the same or similar purposes. The particular technologies described herein are not to be construed as limiting. Rather, various embodiments contemplate alternate technologies for making, using, or practicing various embodiments.

Modifications, additions, or omissions may be made to the method without departing from the scope of the invention. The method may include more, fewer, or other steps. Additionally, steps may be performed in any suitable order without departing from the scope of the invention.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the claims herein.

Detailed Description of Exemplary Embodiments

In at least one embodiment, the invention provides a system and method of recreating an in-store jewelry shopping experience for a customer at a computer. The invention includes generating a live interactive communication session between the customer and a jewelry consultant. The invention also includes generating an interactive design tool to facilitate the design of a unique ring setting.

In at least one embodiment, the invention provides a system and method of displaying advertisements based on the user's actions. For example, a user may enter a text-based search for a particular geographic area, or businesses or points of interest (POI) associated with a geographic area. After a map associated with the user's requested information is displayed, advertisements may subsequently be displayed based on the user's interaction with the map, such as changing the location, viewing POI or selecting particular search results.

Figure 2:
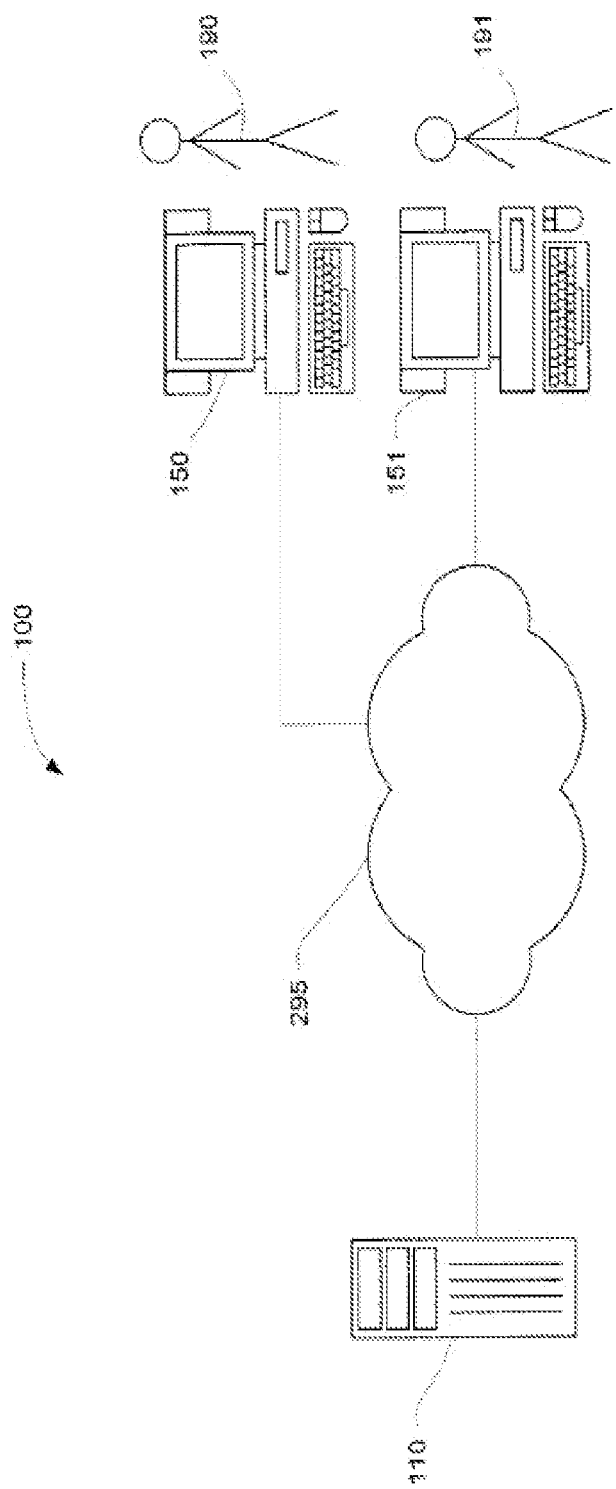
FIG. 2 is a pictorial block diagram of a system in accordance with an aspect of the invention.

As shown in FIGS. 1-2, a system 100 in accordance with one aspect of the invention includes a computer 110 containing a plurality of processors 210, memory 220 and other components typically present in general purpose computers.

Memory 220 stores information accessible by at least one processor 210, including instructions 240 that may be executed by the processor 210 and data 230 that may be retrieved, manipulated or stored by the processor. The memory may be of any type capable of storing information accessible by the processor, such as a hard-drive, memory card, ROM, RAM, DVD, CD-ROM, write-capable, read-only memories and other computer media.

The processor may be any number of well known processors, such as processors from Intel Corporation. Alternatively, the processor may be a dedicated controller such as an ASIC.

The instructions 240 may be any set of instructions to be executed directly (such as machine code) or indirectly (such as scripts) by the processor. In that regard, the terms "instructions," "steps" and "programs" may be used interchangeably herein. The instructions also function as an algorithm allowing the processor to perform the purposes intended by the instructions. The instructions may be stored in object code form for direct processing by the processor, or in any other computer language including scripts or collections of independent source code modules that are interpreted on demand or compiled in advance. Functions, methods and routines of the instructions are explained in more detail below.

Data 230 may be retrieved, stored or modified by processor 210 in accordance with the instructions 240. For instance, although the invention is not limited by any particular data structure, the data may be stored in computer registers, in a relational database as a table having a plurality of different fields and records, XML documents, or flat files. The data may also be formatted in any computer readable format such as, but not limited to, binary values, ASCII or Unicode. Moreover, the data may comprise any information sufficient to identify the relevant information, such as descriptive text, proprietary codes, pointers, references to data stored in other memories (including other network locations) or information which is used by a function to calculate the relevant data.

Although the processor and memory are functionally illustrated in FIG. 1 within the same block, it will be understood by those of ordinary skill in the art that the processor and memory may actually comprise multiple processors and memories that may or may not be stored within the same physical housing. For example, some of the instructions and data may be stored on removable CD-ROM and others within a read-only computer chip. Some or all of the instructions and data may be stored in a location physically remote from, yet still accessible by, the processor. Similarly, the processor may actually comprise a collection of processors which may or may not operate in parallel.

In at least one embodiment, computer 110 is a server communicating with one or more client computers 150-151. Each client computer may be configured similarly to the server 110, with a processor, memory and instructions. Each client computer 150-151 may be a personal computer, intended for use by a person 190-191, having all the internal components normally found in a personal computer such as a central processing unit (CPU), display 160, CD-ROM, hard-drive, user input devices (for example, a mouse, keyboard, touch-screen or microphone), speakers, modem and/or network interface device (telephone, cable or otherwise) and all of the components used for connecting these elements to one another. Moreover, computers in accordance with the systems and methods described herein may comprise any device capable of processing instructions and transmitting data to and from humans and other computers, including general purpose computers, network computers lacking local storage capability, PDA's with modems and Internet-capable wireless phones.

The server 110 and client computers 150-151 are capable of direct and indirect communication, such as over a network 295. Although only a few computers are depicted in FIGS. 1-2, it should be appreciated that a typical system can include a large number of connected computers, with each different computer being at a different node of the network 295. The network, and intervening nodes, may comprise various configurations and protocols including the Internet, intranets, virtual private networks, wide area networks, local networks, private networks using communication protocols proprietary to one or more companies, Ethernet, WiFi and HTTP. Such communication may be facilitated by any device capable of transmitting data to and from other computers, such as modems (e.g., dial-up or cable), networks and wireless interfaces. Server 110 may be a web server.

Although certain advantages are obtained when information is transmitted or received as noted above, other aspects of the invention are not limited to any particular manner of transmission of information. For example, in some aspects, the information may be sent via a medium such as a disk, tape or CD-ROM. In other aspects, the information may be transmitted in a non-electronic format and manually entered into the system. Yet further, although some functions are indicated as taking place on a server and others on a client, various aspects of the invention may be implemented by a single computer having a single processor.

The data 230 includes inventory database 270. Inventory database 270 provides jewelry images 272 in response to requests for information associated with a particular jewelry item. The system and method is not limited to a specific manner of expressing the location. For example, the location may be expressed in terms of street address, city name or latitude/longitude.

The system and method is not limited to a particular type or format. The jewelry images returned by the inventory database 270 may be a bitmap, vector file, or other image format. Inventory database 270 also may include jewelry data 274. Jewelry data may be any relevant information of interest to customers seeking to purchase a jewelry item. For example, where the jewelry item is a loose diamond, jewelry data 274 may include: diamond shape, carat weight, color grading, clarity grading, depth percentage, table percentage, polish options, symmetry options, fluorescence options and exact measurements, price/carat, total price, girdle and lot number of the diamond.

Inventory database 270 also may include grading reports 276, which are stored as images. The grading reports may come from any number of reputable diamond certification organizations, such as GIA (Gemological Institute of America), AGS (American Gem Society), EGL (European Gemological Laboratory) and HRD (Hoge Raad voor Diamant or the Diamond High Council).

A user at computer 150 may request jewelry information by connecting to server 110. For example, by logging into a website with a browser, a user may search specific information such as shape, cut, clarity or price of a loose diamond.

Figure 3A:
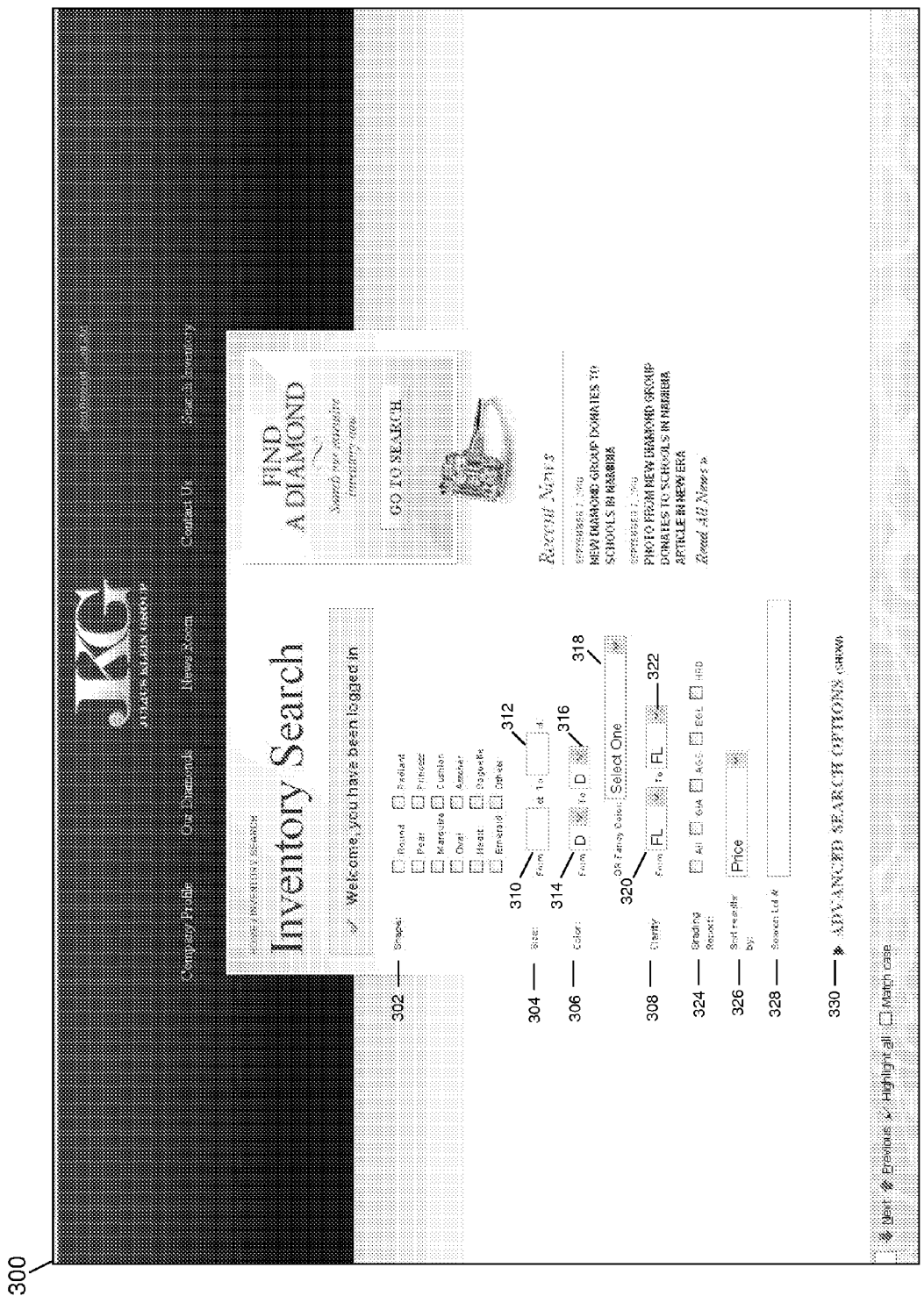
FIG. 3a is a screenshot of the Inventory Search Page.

FIG. 3a illustrates how a screen in accordance with an aspect of the system and method may look when a customer searches for a loose diamond. In one embodiment, the website is open to the public for browsing. In another embodiment, the system requires that new customers first register by entering personal information and selecting a unique identifier and a password. Once registered, the new customer is provided with access to the inventory of the online jewelry store.

In at least one embodiment, the system sorts the available inventory into multiple categories. These categories may be displayed on the initial page of the website. After a customer selects a category, the website filters the inventory in accordance to the selected category. The customer may further edit the results by selecting one or more subcategories. For example, if the customer selects a category of "diamonds," then the website will present a selection of available diamonds. The customer may further edit the selection of diamonds by selecting a subcategory of "round" shaped stones, so that the website filters the inventory of diamonds to present only round stones.

The category may include a type of finished jewelry piece, such as rings, bracelets, pendants, necklaces, earrings, cuff links, money clips, key chains, and watches. The category also may include a type of precious gemstone, such as amethysts, diamonds, emeralds, opals, onyxes, pearls, rubies, and sapphires. Additionally, the category may include a type of precious metal, such as gold, platinum, silver and titanium. The category also may include a special event or a gift recipient. Some examples of special event categories may include an anniversary, a baptism, a birthday, an engagement, a first communion, a graduation, a push present for the birth of a child and a wedding. Examples of gift recipient categories may include a fiancé/fiancée, a husband/wife, a mother/father, a daughter/son, a grandmother/grandfather, a boss/secretary and a woman/man.

Figure 3B:
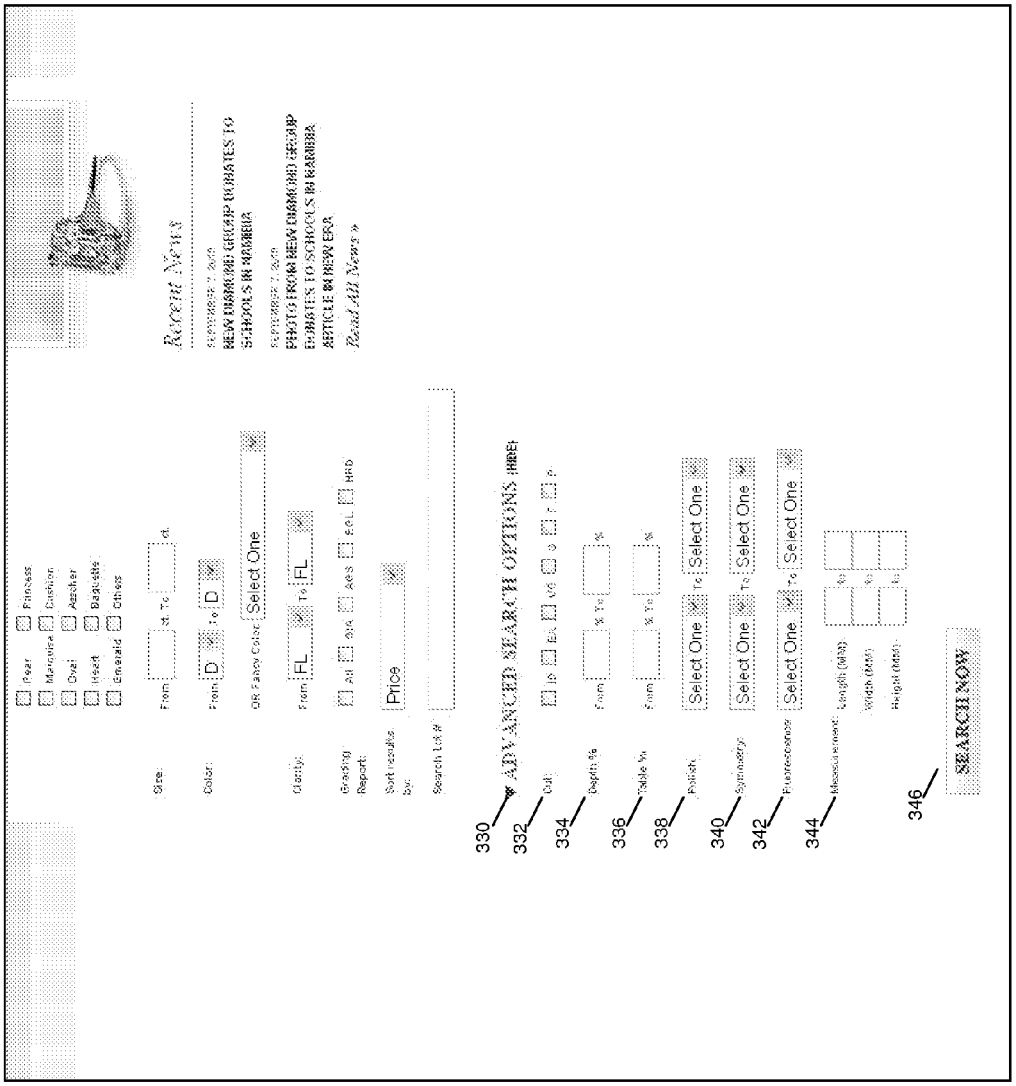
FIG. 3b is a screen shot of the advance search option of the Inventory Search Page.

FIGS. 3a and 3b illustrate an exemplary example in which the customer is shopping for a loose diamond. Although the customer in the exemplary example is shopping for a loose diamond that will be set in a ring setting, the invention is not limited to selling loose diamonds alone. As described below, the invention is applicable to any item that might be sold by an online jewelry store.

In the exemplary example, the customer selects a category of "diamonds." He is then directed to Inventory Search Page 300, which provides a number of search parameters for further refining the search.

The search parameters may include search parameter 302 that comprises the available diamond shapes. Some examples of diamond shapes may include round, pear, marquise, oval, heart, emerald, radiant, princess, cushion, Asscher and baguette shapes. The customer selects one or more diamond shapes to be included in his inventory search.

Inventory Search Page 300 also may include search parameters 304, 306 and 308, which are directed to a desired range for, respectively, the carat size, the color and the clarity of the diamond.

Any tool may be used for indicating the desired range. In at least one embodiment, the customer enters alpha-numeric text into one or more search boxes. The search boxes may be directed to a minimum amount and a maximum amount. In at least one embodiment, each of the text boxes is a drop down box comprising a number of options relevant to the text box. For example, a drop down box for diamond color may provide the options of a D color to a Z color.

In at least one embodiment, the customer uses a sliding scale tool bar to indicate his desired range. The sliding scale tool comprises two cursors located on either end of the sliding scale. The two cursors represent the minimum and maximum indicators of the sliding scale. By clicking on a cursor, the customer can move the cursor to mirror his desired minimum and maximum quantity. For example, if customer wishes to purchase a diamond that has a carat size between 1.6 carats and 2.0 carats, then the customer would move the two cursors to bookend 1.6 carats and 2 carats. Alternatively, the customer may enter the decimal numbers 1.6 and 2.0 into, respectively, minimum box 310 and maximum box 312 of search parameter 304.

Search parameter 306 is directed to at indicating the desired color range for a diamond. Typically, the color of a diamond is assesed through a grading scale that ranges from a notation of "D" (which refers to a completely colorless diamond) to a notation of "Z" (which refers to a diamond that is pale yellow or brown color). As described above, the customer may indicate his desired range via a variety of tools. For example, the customer may utilize a drop down box to indicate a minimum color of D in minimum box 314 and a maximum color of F in maximum box 316. In another example, the customer types a letter that corresponds to his desired minimum and maximum colors directly into boxes 314 and 316.

Additionally, the customer may indicate, using drop down box 318, whether he is interested in a "fancy colored" diamond, e.g. a diamond that possess a desirable natural color. In at least one embodiment, drop down box 318 offers the fancy color choices in order to increasing intensity, such as Faint, Very Light, Light, Fancy Light, Fancy, Fancy Intense, Fancy Vivid, Fancy Dark, and Fancy Deep.

Search parameter 308 allows the customer to indicate the desired clarity range. A diamond's clarity refers to the presence of identifying characteristics or flaws on the stone. The flaws may be internal to the stone (or called inclusions). Some examples of inclusions may include air bubbles, cracks, and non-diamond minerals found in the diamond. External or surface flaws to a diamond are called blemishes. Some examples of blemishes may include scratches, pits, and chips on the diamond. Diamonds with none or few inclusions and blemishes have greater clarity, and thus are more highly valued.

The most desirable clarity grading is an F (Flawless) or IF (Internally flawless) diamond. A diamond with an F rating has no internal or external flaws, and thus it is extremely rare. Equally rare is an IF diamond, which has some surface flaws, but no internal flaws. Next are "Very, Very Slightly Included" diamonds (VVS1 and VVS2) which contain minute inclusions that are very difficult to detect under 10× magnification by a trained gemologist. The next level of clarity grading is the "Very Slightly Included" diamonds (VS1 and VS2). These diamonds have minute inclusions that can be detected with difficulty under a 10× magnification. The next level of clarity grading are "Slightly Included" diamonds (SI1 and SI2), which contain minute inclusions that are easily detected under a 10× magnification. The last level of grading is the "Included" (I1) diamonds that have noticeable flaws.

The customer may indicate a desired search range for the diamond's clarity using any number of tools. In the exemplary example of FIG. 3, the customer enters the criteria in minimum box 320 and maximum box 322, which are drop down boxes with options that correspond to the various clarity levels.

Inventory Search Page 300 also includes search parameter 324 which allows the customer to select the type of grading report of the diamond. Diamond grading reports may come from any number of reputable diamond certification organizations, such as GIA (Gemological Institute of America), AGS (American Gem Society), EGL (European Gemological Laboratory) and HRD (Hoge Raad voor Diamant or the Diamond High Council). Some organizations are valued more highly than others, thus search parameter 334 provides the customer with an opportunity to limit his search to only diamonds possessing certain grading reports.

Although not shown in FIGS. 3a and 3b, in at least one embodiment, Inventory Search Page 300 also offers a search parameter directed to the desired price range for the diamond purchase.

Sort parameter 226 allows the customer to sort the search results in accordance to the price of the diamond or any one of search parameters 302, 304, 306, 308 and 324.

In at least one embodiment, customer wishes to view a specific diamond. In such instances, he can enter directly a unique identifier (i.e., the lot number) for that particular diamond in lot number box 328.

FIG. 3b illustrates additional search options that customer may access on Inventory Search Page 300. Advanced Search Options 330 is hidden on the initial Inventory Search Page 300, but once the customer clicks on Advanced Search Options 330, he is able to view a plurality of additional search parameters.

As shown in FIG. 3b, Advanced Search Options 330 may offer additional search parameters 332, 334, 336, 338, 340, 342 and 344, which correspond, respectively, to cut options, depth percentage, table percentage, polish options, symmetry options, fluorescence options and exact measurements. However, Advanced Search Options 330 is not limited to only search parameters 332-344, but rather, it may include any relevant search criteria.

Once the customer has finished specifying the desired criteria for his inventor search, he selects search button 346 to submit the selected search criteria. The system processes the submitted search criteria and returns the results in table 400.

Figure 4A:
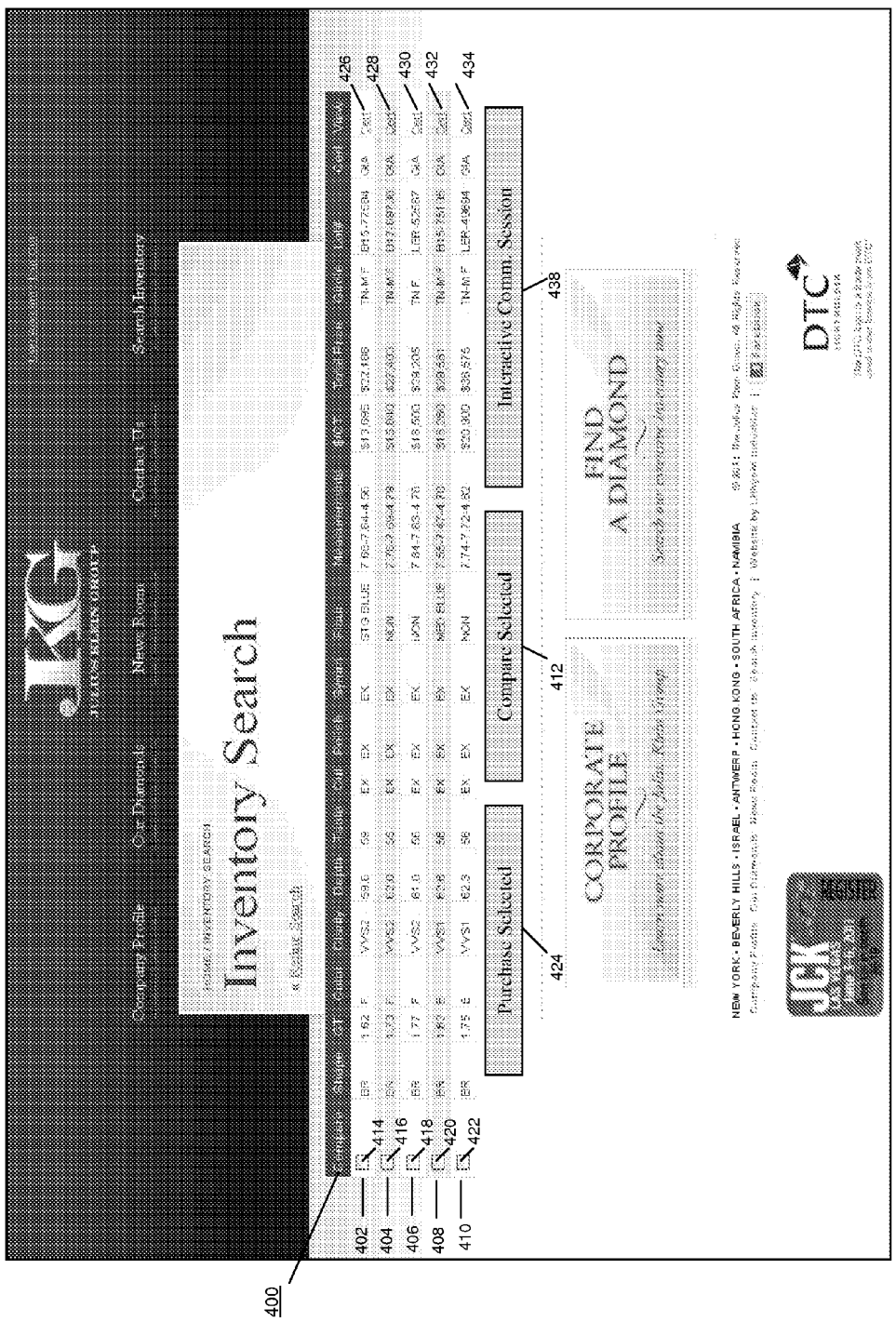
FIG. 4a is a screen shot of the search results, after the user action of searching

FIG. 4a illustrates a set of search results displayed in a tabular format 400. Table 400 displays the search results in a plurality of rows 402-410. Each of rows 402-410 represents a particular diamond that matches to the customer's search criteria.

In at least one embodiment, each of rows 402-410 comprises information that is relevant to its corresponding jewelry item. Examples of relevant information may include, but not limited to, a photograph, a price, and a brief description of the jewelry item. Where the jewelry item is a loose diamond, the brief description may include the cut, clarity, color and carat of the stone.

Figure 5:
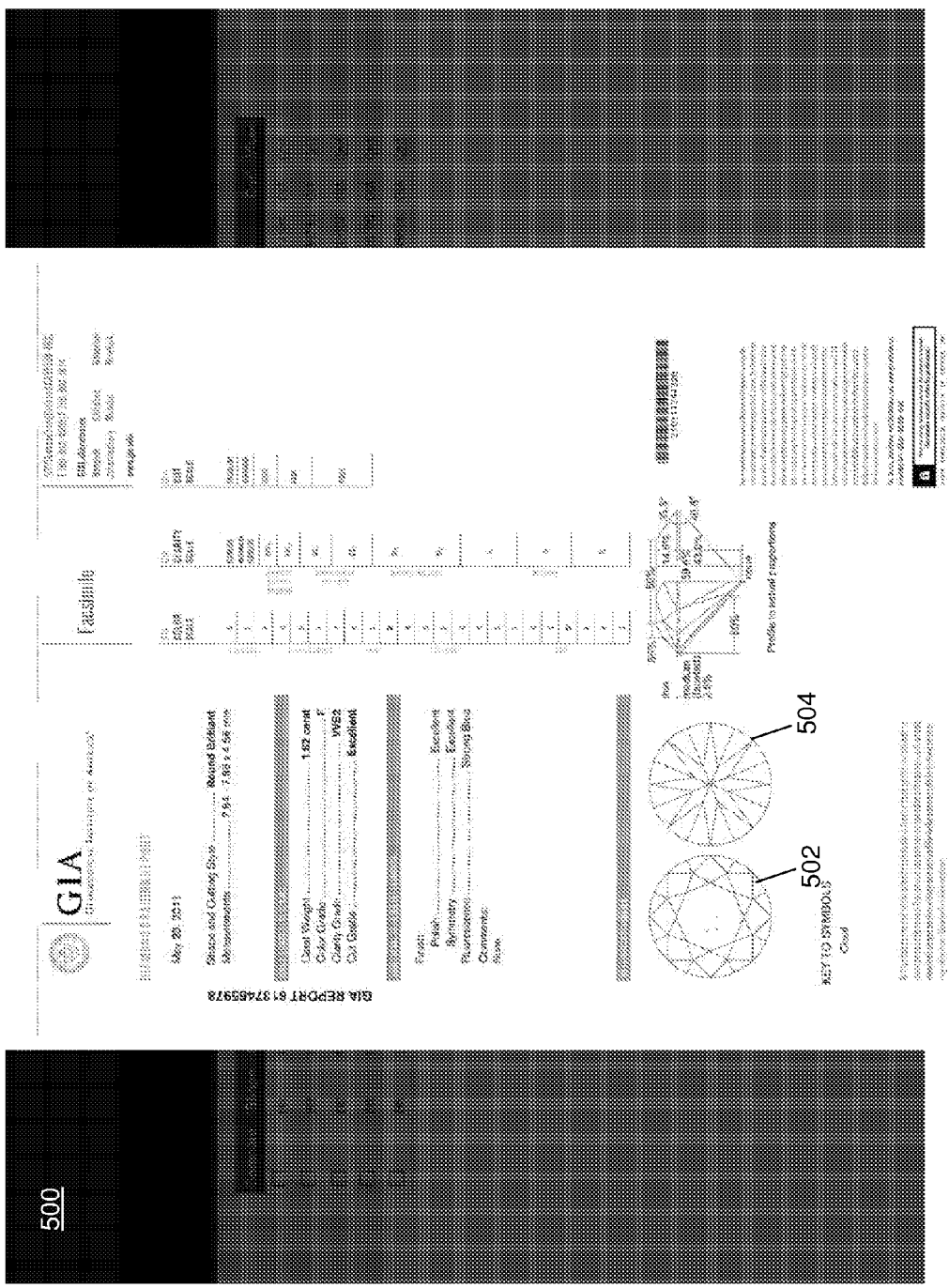
FIG. 5 is a screen shot of a certified grading report, after the user action of selecting a certificate link.

Each of rows 402-410 also includes certificate links 426-434, which provide the customer with an image view of the actual grading report of the diamond. For example, FIG. 5 illustrates a detailed view of grading report 500 associated with diamond of row 402. The customer accessed grading report 500 by clicking on corresponding certificate link 426.

Certificate 500 contains both quantitative information (e.g., measurements of the weight and other physical dimensions of the diamond) and qualitative information (e.g., grades in three major areas of cut, clarity and color). Certificate 500 also may provide pictorial diagrams 502 and 504, which illustrate the inclusion locations of the diamond.

Referring back to FIG. 4a, customers may select one or more jewelry items by clicking on check boxes 414-422. Check boxes 414-422 correspond to each of rows 402-410. Once the one or more jewelry items are selected, the customer has several options regarding the selected items. In at least one embodiment, the customer has the option of comparing at least two selected jewelry items. In another embodiment, the customer can purchase the selected jewelry items. Still in another embodiment, the customer can request an interactive communication session with a live jewelry consultant in order to learn more about the selected jewelry items.

To compare selected jewelry items, the customer selects at least two check boxes 414-422. In the exemplary example shown in FIG. 4a, the customer selects check boxes 402, 406 and 410, and then he selects compare button 412. The system filters the search results from table 400 and displays only the diamonds associated with check boxes 402, 406 and 410. The comparison results are displayed in table format, which advantageously allows the customer to differentiate between the selected diamonds in a single view. The customer is able to quickly determine the similarities and differences between each characteristic of the compared diamonds, such as the shape, clarity or price of the diamond.

To purchase the selected jewelry item, the customer again selects one or more jewelry items by checking corresponding boxes 414-422. The customer then selects purchase button 424, which places the selected jewelry items in an online shopping cart. The customer then has the option to continue shopping for additional jewelry items, or he may choose to check-out immediately.

If the customer selects to check-out immediately, the system transfers the customer to a separate purchasing page. The purchasing page may request payment information, such as a credit card number and billing address of the customer. The purchasing page also may inquire as to the desired delivery option, the address of the recipient, and an indication of whether the jewelry items are intended as gifts.

Where the jewelry items are intended as gifts, the purchasing page provides the option to gift wrap the purchased jewelry items before shipping to the gift recipient.

In at least one embodiment, the purchasing page also provides the option of insuring the purchased jewelry items through a company that specializes in jewelry insurance. One advantage of providing insurance coverage through specialized jewelry insurance is that the coverage may be greater than a standard homeowners' policy. For example, the homeowner's policy only may replace a lost or stolen ring, rather than paying a set cash amount. Furthermore, many individuals purchasing jewelry items online may not have the time or opportunity to obtain insurance coverage immediately. By providing the option to purchasing insurance, the purchasing page provides an additional convenience to the customer.

I. Interactive Communication Session with Jewelry Consultant

Referring back to FIG. 4a, the customer also may desire to learn more about one or more jewelry items. For instance, the customer may wish to view a particular diamond under a microscope in order to see a particular inclusion of the diamond. Furthermore, the customer also may wish to inquire a live expert regarding one or more jewelry items. Thus, the customer may wish to request an interactive communication session with a jewelry consultant, e.g., by clicking on or otherwise selecting an indicia such as button 438. In at least one embodiment, the customer requests the interactive communication session by clicking on a link.

In at least one embodiment, the jewelry consultant is a certified gemologist. In at least another embodiment, the jewelry consultant is a sales associate with knowledge of (and/or access to information about) one or more items in the inventory, but does not hold any certification.

The customer may select one or more jewelry items by selecting (e.g., by checking) corresponding boxes 414-422. To request an interactive communication session, the customer may then select Interactive Communication Session button 438. In response, the system generates a request that is submitted to the online jewelry store.

A customer may request an interactive communication session at any point during the purchasing process. In at least one embodiment, the customer requests an interactive communication session at the beginning of the purchasing process. For example, the customer may be an inexperienced shopper with many questions regarding the diamond purchasing process. He may seek the counsel of a jewelry consultant to guide him through the selections.

In another embodiment, the customer requests the interactive communication session in the middle of the purchasing process. For example, the customer may wish to view an inclusion of the diamond under the microscope, e.g., to determine the degree or extent to which the inclusion is visible to the eye, e.g., under varying degrees of magnification. He also may wish to see a quality-related test being performed on a particular jewelry item, or to see or inspect the results of one or more such tests. In another example, the customer also may request that the jewelry consultant provide a relative comparison of a selected diamond against a benchmark item, such as a coin or another diamond (e.g., to provide a relative size, color, shape, or cut comparison).

In yet another embodiment, the customer requests the interactive communication session towards the end of the purchasing process. In this example, the customer may have narrowed down his purchasing options to two similar diamonds and may wish to obtain a side-by-side comparison of the two stones.

Figure 6:
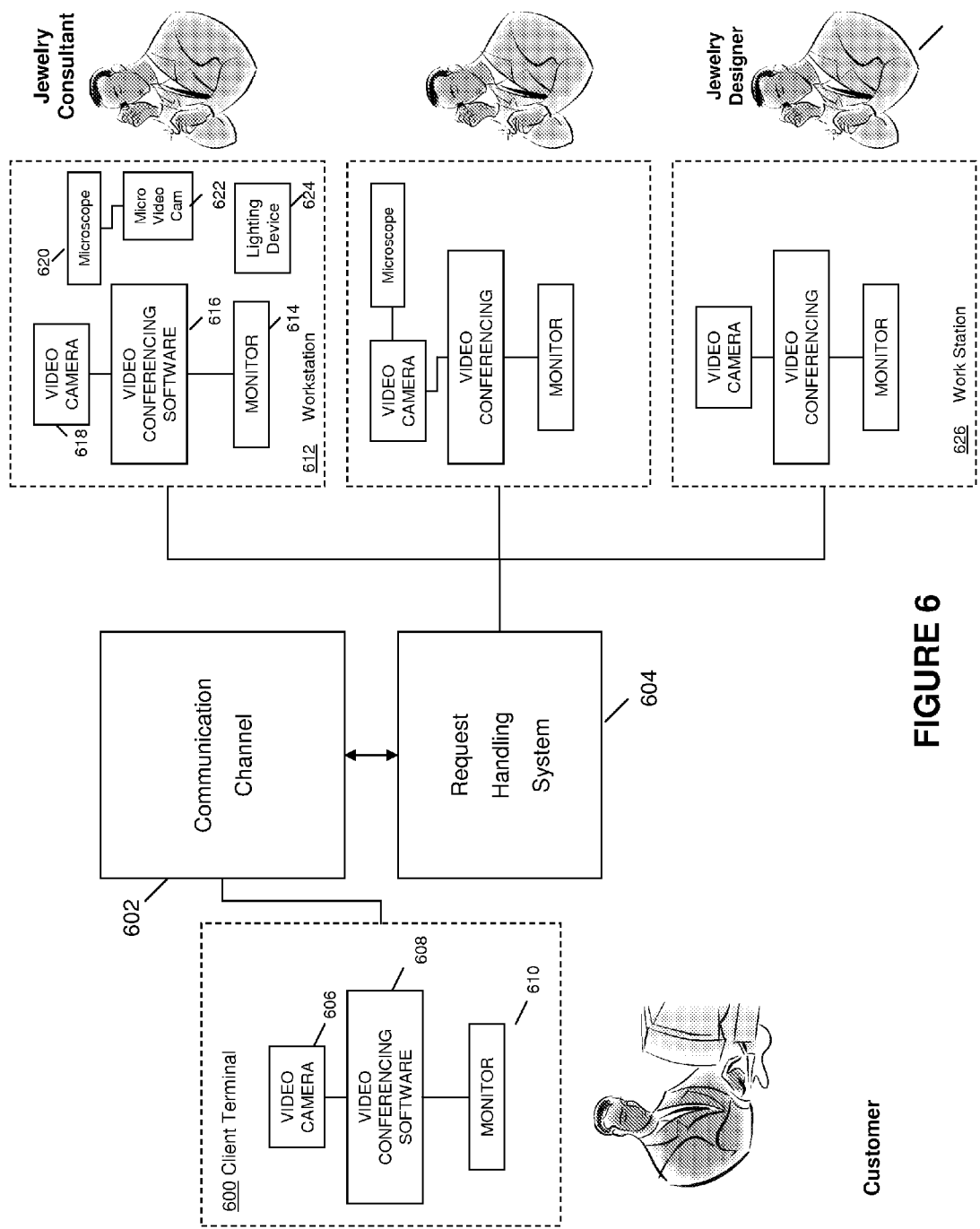
FIG. 6 is a pictorial block diagram of a system in accordance with an aspect of the invention.

FIG. 6 illustrates a block diagram of an interactive communication session between the customer and a jewelry consultant. Once the customer has selected button 438 to request an interactive communication session, client terminal 600 automatically sends the request over communication channel 602 to request handling system 604. The request includes a unique identifier for each jewelry item of interest. In at least one embodiment, the unique identifier is the lot number of a diamond.

In at least one embodiment, client terminal 600 is a desktop computer that comprises video camera 606 that is capable of transmitting video images. Client terminal 600 also may include videoconferencing software 608 which facilitates the interactive communication session between the customer and the jewelry consultant. The client terminal may also comprise monitor 610 that is capable of displaying received video images and outputting audio sound from the interactive communication session. In at least one embodiment, monitor 610 also displays the website simultaneously with the video images from the interactive communication session.

In at least one embodiment, the interactive communications session is one-way, in that only the customer can see the jewelry consultant. In such instances, the customer may have the option to turn off video camera 606. In another embodiment, client terminal 600 does not have a video camera.

In at least one embodiment, the customer wishes to schedule the interactive communication session a later time; as such, the customer may include a desired date and time in his request for interactive communication session.

In one embodiment, request handling system 604 randomly assigns the customer to a first available jewelry consultant. In another embodiment, the customer specifies a particular jewelry consultant for the interactive communication session. The customer may include the name of the consultant in the request that is submitted to request handling system 604. For example, the customer may have developed a positive working experience with a particular jewelry consultant. Thus, the customer may wish to continue working with this same jewelry consultant. In another example, the customer may wish to specify a particular jewelry consultant based on a personal reference or recommendation.

In at least one embodiment, the customer selects a jewelry consultant based on the jewelry consultant's public profile, which is displayed on the website. The public profile may include a photograph of the individual and a biography of the individual's background. The biography may include all relevant work experiences, the type of diamond certifications held by the individual, and any professional associations and affiliations of the jewelry consultant.

In at least one embodiment, the customer provides a "blacklist" of jewelry consultants to request handling system 604. The blacklist includes the names of jewelry consultants with whom the customer does not wish to schedule an interactive communication session. For example, the customer may have experienced an unpleasant encounter with a particular jewelry consultant, and as such, he may desire to avoid working that individual in all future transactions.

In at least one embodiment, the customer does not specify the name of the jewelry consultant, but instead, he provides one or more desired criteria for the jewelry consultant. For example, the customer might indicate that he wishes to meet with a female jewelry consultant. In matching the customer with a jewelry consultant, request handling system 604 would take into account the customer's desired criteria and match the customer with the first available jewelry consultant having the desired criteria traits.

In some embodiments, the customer may review a plurality of profiles (e.g., of available consultants) and select a consultant based on the profiles. The customer may also search for a plurality of profiles based on one or more criteria, such as years of experience, education level of the consultant (e.g., bachelor's degree or other degree), location of the consultant (e.g., the New York diamond district, or a location within a certain number of miles of the customer), native language of the consultant, special technology available to the consultant (e.g., a specific type of microscope or set of tests that can be performed or interpreted by the consultant), customer review scores of the consultant, and other criteria. In at least one embodiment, the customer indicates a level of experience of the jewelry. For example, the customer may wish to meet with a certified gemologist, rather than a sales associate. The customer also might indicate the type of certification held by the jewelry consultant, such as only AGS certified individuals. The customer also may wish to meet with jewelry consultants that have at least 10 years of experience.

In at least one embodiment, the website provides the sales figures for each jewelry consultant. The website also may include additional details, such as the quantity of transactions conducted by a jewelry consultant for a specific type of gemstone or a specific type of finished jewelry piece. For example, the website may indicate that Jewelry Consultant A is an expert in diamond engagement rings, whereas Jewelry Consultant B specializes in watches. Using the provided information, the customer may choose to work with a jewelry consultant that has the highest number of transactions in a particular type of finished jewelry pieces, such as diamond engagement rings. The customer may decide to work with this individual because he believes the jewelry consultant has the most relevant experience pertaining to his purchase.

In at least one embodiment, the website allows previous customers to write a review for each jewelry consultant. The website also may allow previous customers to rank each jewelry consultant, such as awarding one to five stars to the individual. The ranks also may encompass various categories directed to customer service, knowledge of the inventory, responsiveness to follow-up questions and timeliness for the interactive communication session. The reviews and rankings may be published on the website next to each jewelry consultants' profiles. In one example, the customer selects a jewelry consultant based on the ranking and reviews posted.

In at least one embodiment, the website sets up parameters to ensure the integrity of the rank and review process. A customer may be provided with a unique identification code for a particular jewelry consultant at the end of an interactive communication session with that individual. Only customers with the unique identification code may review and rank that particular jewelry consultant. Such a system helps ensure the integrity of the rank and review process.

As shown in FIG. 6, request handling system 604 identifies a jewelry consultant for the customer. Request handling system 604 then sends the request to the jewelry consultant's workstation 612. In at least one embodiment, the jewelry consultant may accept the request by clicking on a button or a link to indicate that he is available for the requested date and time of the interactive communication session. Jewelry consultant workstation 612 then transmits an indication of the jewelry consultant's acceptance back to request handling system 604. In response, request handling system 604 generates an interactive communication session between client terminal 600 and workstation 612 at the requested date and time.

In at least one embodiment, the jewelry consultant is not available for the interactive communication session at the requested date and time. For example, the jewelry consultant may be helping another customer. In another example, the selected jewelry items are unavailable at the requested date and time. The selected jewelry items may need to be retrieved from an off-site location. In such instances, the jewelry consultant may click on a button or a link to indicate that he is unavailable for the requested interactive communication session. Workstation 612 then transmits an indication of the jewelry consultant's unavailability back to request handling system 604. The customer then has the option of either meeting with a different jewelry consultant or suggesting an alternative date and time for the interactive communication session.

Jewelry consultant's workstation 612 may comprise a computing device that is connected to monitor 614, which displays received video images and audio files from client terminal 600. Workstation 612 also comprises videoconferencing software 616, which facilitates the interactive communication session between the jewelry consultant and the customer. Workstation 612 also comprises video camera 618 which is capable of capturing and transmitting video images that are transmitted over communication channel 602 to client terminal 600.

Furthermore, workstation 612 comprises microscope 620, which is connected to a separate video camera 622. After jewelry consultant places the selected jewelry items underneath microscope 620, microscope video camera 622 captures and transmits video images of the selected jewelry items. The video images are transmitted over communication channel 602 and displayed on monitor 610 at client terminal 600.

Figure 7A:
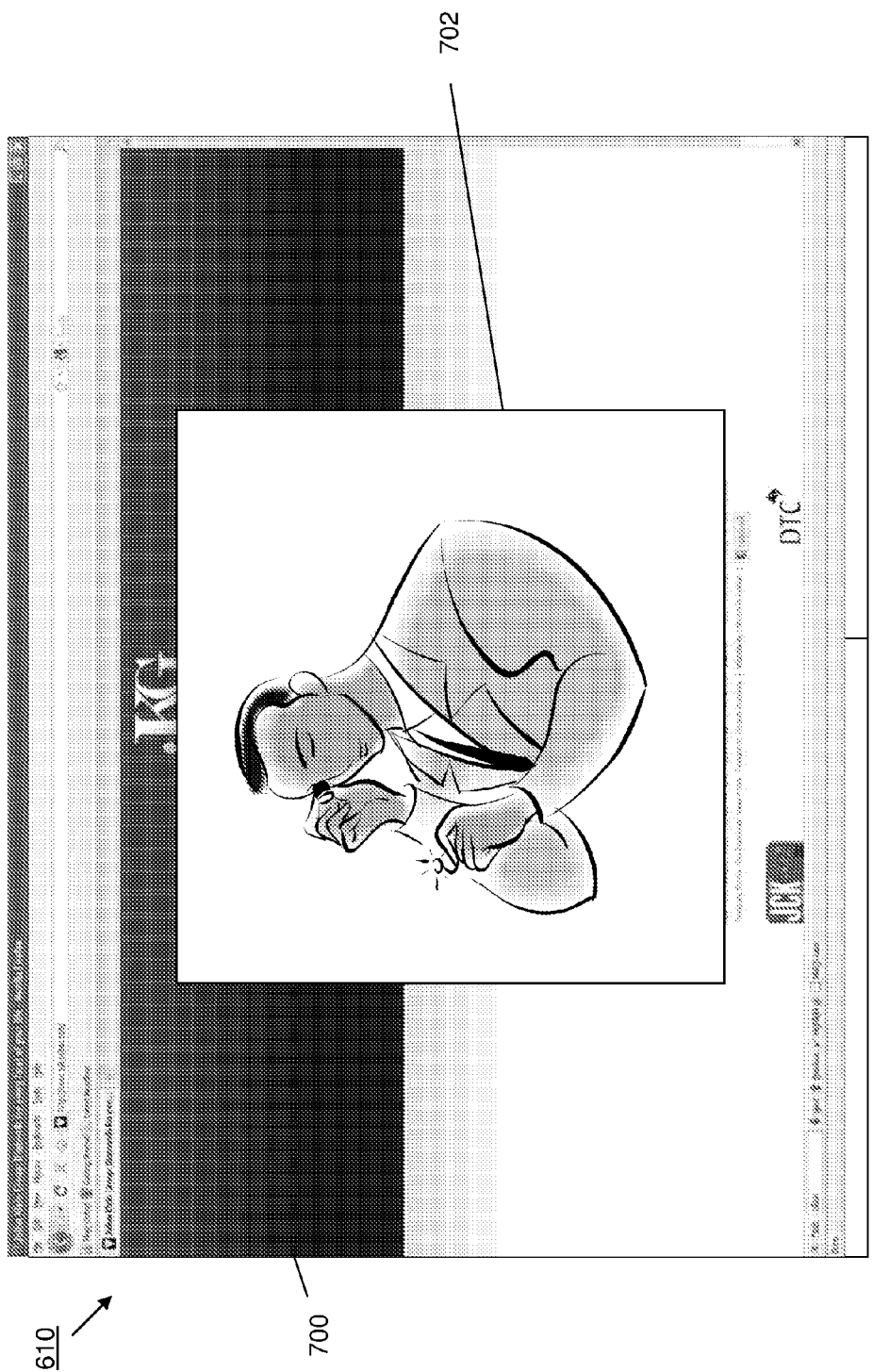
FIG. 7a illustrates an exemplary example of the customer's monitor during an interactive communication session.
Figure 7B:
FIG. 7b illustrates an exemplary example of the customer's monitor during an interactive communication session.

FIGS. 7a and 7b illustrates how the screen on the customer's monitor 610 may look during an interactive communication session with the jewelry consultant. In FIG. 7a, website 700 of the on-line jewelry store shifts to the background of the screen and video box 702 appears in the forefront of the screen. Through video box 702, the customer is able to view the selected diamonds, speak directly with the jewelry consultant and witness first-hand any tests or comparisons conducted by the jewelry consultant at his workstation 612.

In FIG. 7b, video box 704 displays the captured images from microscope video camera 622. When video box 704 appears in the forefront of the screen, video box 702 of the jewelry consultant is minimized to a corner of the screen. Website 700 remains in the background. In at least one embodiment, the customer may toggle between each of the applications (e.g. website 700, video box 702, video box 704). The toggling may occurred via a "Tab" button, or the toggling may occur through the clicking of a mouse, or other means.

In at least one embodiment, the customer verbally instructs the jewelry consultant to adjust the settings on microscope 620. For example, the customer may wish to have microscope 620 magnify the jewelry or a particular part of the jewelry, such as an inclusion on a diamond. The jewelry consultant would adjust the position of the diamond under microscope 620 and zoom in on the inclusion. Microscope video camera 622 captures the images and transmits the images over communication channel 602 to client terminal 600. The attachment of microscope video camera 622 to microscope 620 advantageously provides the customer with access the same information that he would have received at an actual store. The customer may request greater or lesser magnification (e.g., a specific amount of magnification such as 5× or 20×), and may request to focus on different parts of the jewelry (such as the top, middle, bottom, a particular facet, etc.).

In another embodiment, the customer has the ability to remotely control microscope 620 from client terminal 600. The customer may have controls to remotely set any parameter of the microscope. For example, using virtual buttons located at client terminal 600, the customer may communicate instructions directly to microscope 620. For example, the customer may wish to obtain a magnified view of a jewelry item. He then communicates directly with microscope 620 in order to instruct microscope 620 to zoom into the jewelry item. In at least one embodiment, the virtual buttons comprise directional arrows, which allow the customer to adjust the location of the viewfinder on microscope 620. In another embodiment, the virtual buttons comprise a zoom-in button and zoom-out button, which facilitate the magnification underneath microscope 620. In yet another embodiment, the virtual buttons comprise a text box where the customer may type in the desired angle of the viewfinder. The customer may also adjust the focal point of the microscope to view different depths of a jewelry item (e.g., to focus on the top surface of a gem, the middle of a gem, or the bottom of a gem, for example).

In at least one embodiment, the customer examines the diamond under microscope 620 in order to confirm that the certificate number engraved on the diamond matches the certified grading report that is on file for the diamond. This process gives confidence to the customer that he is being shown the actual diamond that he requested.

In at least one embodiment, workstation 612 comprises lighting device 624. Lighting device 624 may comprises a plurality of different light sources, such as an ultraviolet light source, a fluorescent light source, an incandescent light source, neon light source, a blacklight source, and a LED light source. Each light source produces a different quality of light, which when shone on the selected jewelry item (especially a gemstone) will produce a different effect.

The customer may request different lighting conditions for viewing the jewelry, such as lighting conditions that simulate daylight, candlelight, typical office work conditions, and other lighting conditions. In at least one embodiment, the customer may ask to view the diamond under a ultra-violet (UV) light-source. When diamonds are viewed under a ultra-violet (UV) light-source, they tend to fluoresce as blue or violet-blue. Because natural fluorescence can help an off-colored diamond appears as a higher grade, a customer may wish to view a selected diamond under a UV light source in order to identify the fluorescence.

Lighting device 624 also may generate different lighting effects in order to replicate the lighting at a particular time of day. For example, by altering the intensity and color of the emitted light, lighting device 624 attempts to replicate the lighting conditions of morning, afternoon, and evening light. In another embodiment, lighting device 624 replicates the lighting effects of a particular location, such as natural sunlight or indoor light. Such lighting effects allow the customer to gain a better understand of how a particular jewelry item might appear outside the near ideal lighting conditions of a jewelry store.

In at least one embodiment, the customer verbally instructs the jewelry consultant to adjust lighting device 624. In another embodiment, the customer is able to remotely control lighting device 624 via client terminal 600.

In at least one embodiment, the jewelry consultant has a stationary viewing booth device, which helps the jewelry consultant to demonstrate color differences for the customer. The stationary viewing booth may use phosphor day lamps in order to replicate fluorescent daylight. One example of a stationary viewing booth is the GretagMacbeth Judge II Viewing Booth.

II. Side-by-Side Comparison

During the interactive communication session, the customer may request a side-by-side comparison of various jewelry items. A customer may wish to compare two diamonds that have the same characteristics (as listed under table 400) but with different price tags. During the interactive communication session, the customer learns that despite having the same carat weight, color and clarity, the two diamonds do not share equivalent values due to a number of other factors, which are not easily discernable by numbers. These factors may include the placement of the inclusion, the color the inclusion, the cut of the diamond all come into play when determining the value of a diamond. While this information is difficult to ascertain from table 400 alone, the information is easily demonstrated during the live interactive communication session. For instance, the customer may see first hand the placement of the inclusion under microscope 620.

A customer also may wish to compare two diamonds of different characteristics, such as different carat size, color or clarity. For example, a customer may have difficulty grasping the difference between a F color and a G color. Thus, the jewelry consultant can demonstrate the differences between the characteristics during the live interactive communication session.

Additionally, a customer may wish to discern whether a diamond with the less desirable characteristic (e.g., smaller carat size, lower clarity) is noticeably different from the diamond with the more desirable characteristic. For example, the customer may witness firsthand that a 1.8 carat diamond is not noticeably different from a 2 carat diamond due to the way the smaller diamond was cut.

III. Relative Size Comparison

In at least one embodiment, the customer may request a relative-size comparison of the selected jewelry items during the interactive communication session. The customer may wish to compare the jewelry item against a benchmark item in order to determine the actual size of the jewelry item. For example, the jewelry consultant may place a 2 carat diamond next to a dime, in order to help the customer understand the relative size of the diamond. The jewelry consultant places both the jewelry item and the benchmark item in front of video camera 620, and the video images of both items are transmitted over communications channel 602 to be displayed on monitor 610.

Any number of objects may be used as a benchmark item. The benchmark item may be a common everyday item, such as a coin, a thimble, a cell phone or a paperclip. The benchmark item also may be a ruler or grid with numeric markings.

In at least one embodiment, the customer instructs the jewelry consultant to use a specific type of benchmark instrument. For example, a foreign customer may request the use of a coin from his country of origin.

In another embodiment, the benchmark item is an "average sized" diamond. A customer may be concerned about not purchasing a stone that is considered "too small" by his fiancée and her peers. Thus, the customer may ask the jewelry consultant to show him the "average-sized diamond", i.e., the most commonly purchased diamond size. The customer may wish to compare his selected diamonds against the average-sized diamond, in order to determine whether his selections are too small.

In at least one embodiment, relative-size is demonstrated through the use of a hand model. The hand model may be made from plastic, wax or some other synthetic material. The hand model also may be constructed in a similar fashion to that of a mannequin hand.

The hand model may come in a variety of sizes, colors and shapes. Size increments may include petite, small, medium, large and extra-large. The hand model may be crafted to mirror the dimensions of the average female hand or the average male hand. The hand model also may be crafted to mirror the dimensions of a child-sized hand and an adult-sized hand. The hand model also may come with different finger lengths and sizes, in an attempt to more accurately mirror the customer or the gift recipient's hand. The hand model also may be constructed in a variety of skin tones.

During the interactive communication session, the jewelry consultant may select a hand model that most closely matches the customer or the gift recipient. The jewelry consultant may place the selected jewelry item, such a diamond engagement ring, on the hand model in order to help the customer visualize how the jewelry item would look on the gift recipient. For example, the customer may determine, after inspecting a selected diamond ring on a hand model, that the selected diamond appears too small on the hand model. In another example, the customer may wish to use the hand model to determine the most attractive shape of a diamond. The customer may determine that an oval diamond best accentuates a hand with long, slender fingers. Still in another example, the hand model may be used to determine which metal band best accommodates a particular skin tone. The customer may determine that a yellow-gold band is unflattering against a yellow-based skin tone, and as a result, he may decide to purchase a platinum band instead.

In at least one embodiment, the hand model is provided by a live person. The

IV. Various Tests Conducted

Referring back to FIG. 6, the jewelry consultant also performs a variety of tests on the jewelry item during the interactive communication session. The tests may be quality-related tests. The quality-related tests may be used to demonstrate or highlight specific characteristics of a jewelry item. The quality-related tests also may provide additional information that is not available in a standard grading report. The jewelry consultant also may conduct authenticity-related tests that seek to verify the authenticity of a jewelry item, such as a diamond.

In at least one embodiment, the tests are conducted during the interactive communication session in real-time. In such instances, the necessary tools and devices for conducting the tests are available at the jewelry consultant's workstation 612. The customer witnesses the test being performed by the jewelry consultant in real-time. In some embodiments, the customer may simply request or view the results of one or more tests which may have been conducted in advance of the communication session. For example, such test results may be stored and accessible via the profile of the jewelry item.

The tests also may generate a variety of test results. Such test results may include reports, images and measurement results. In at least one embodiment, the test results are displayed simultaneously on the jewelry consultant's monitor 614 and the customer's monitor 610. In another embodiment, the jewelry consultant electronically sends the test results to the customer's client terminal 600.

Figure 7C:
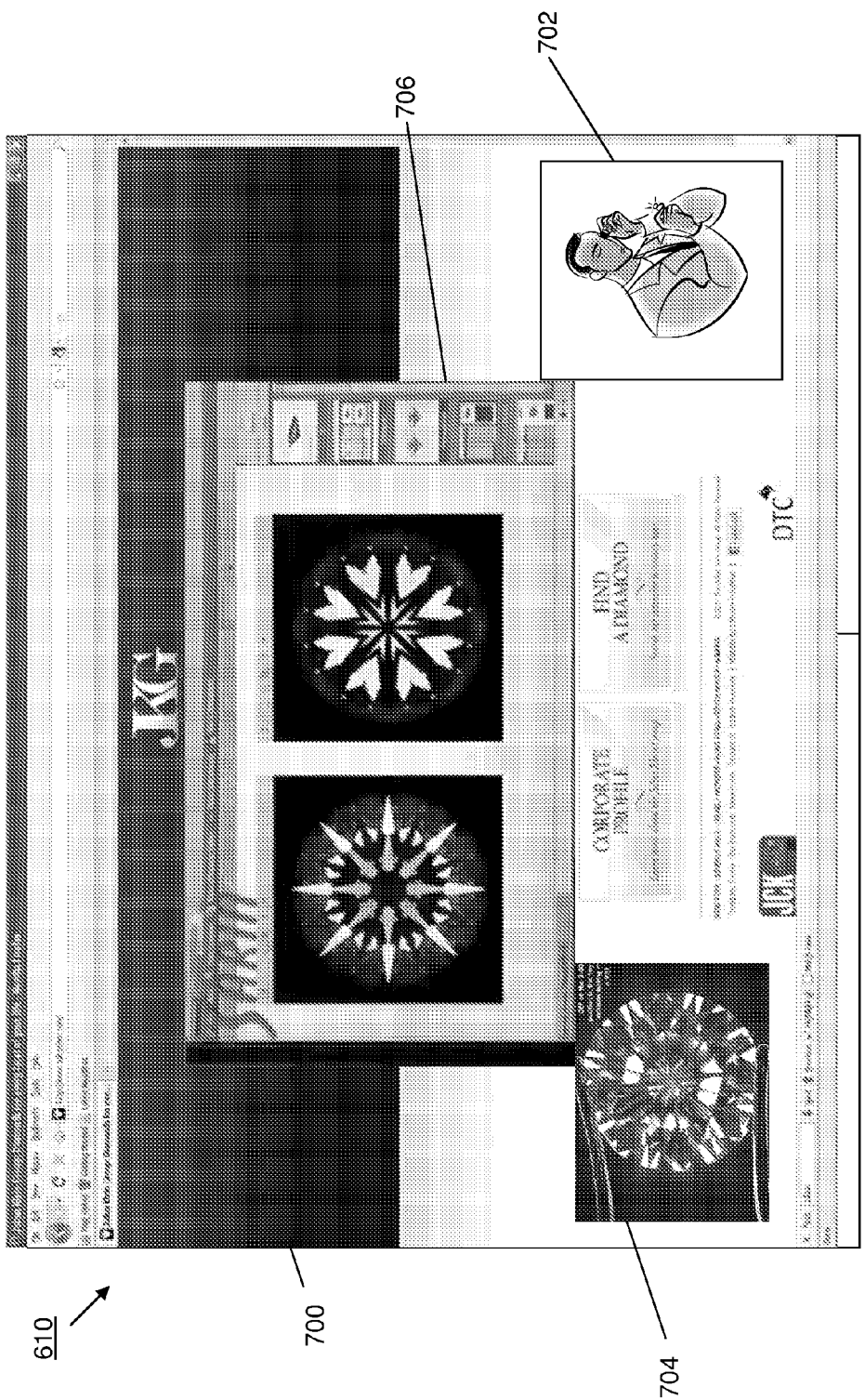
FIG. 7c illustrates an exemplary example of the customer's monitor during an interactive communication session.
Figure 7D:
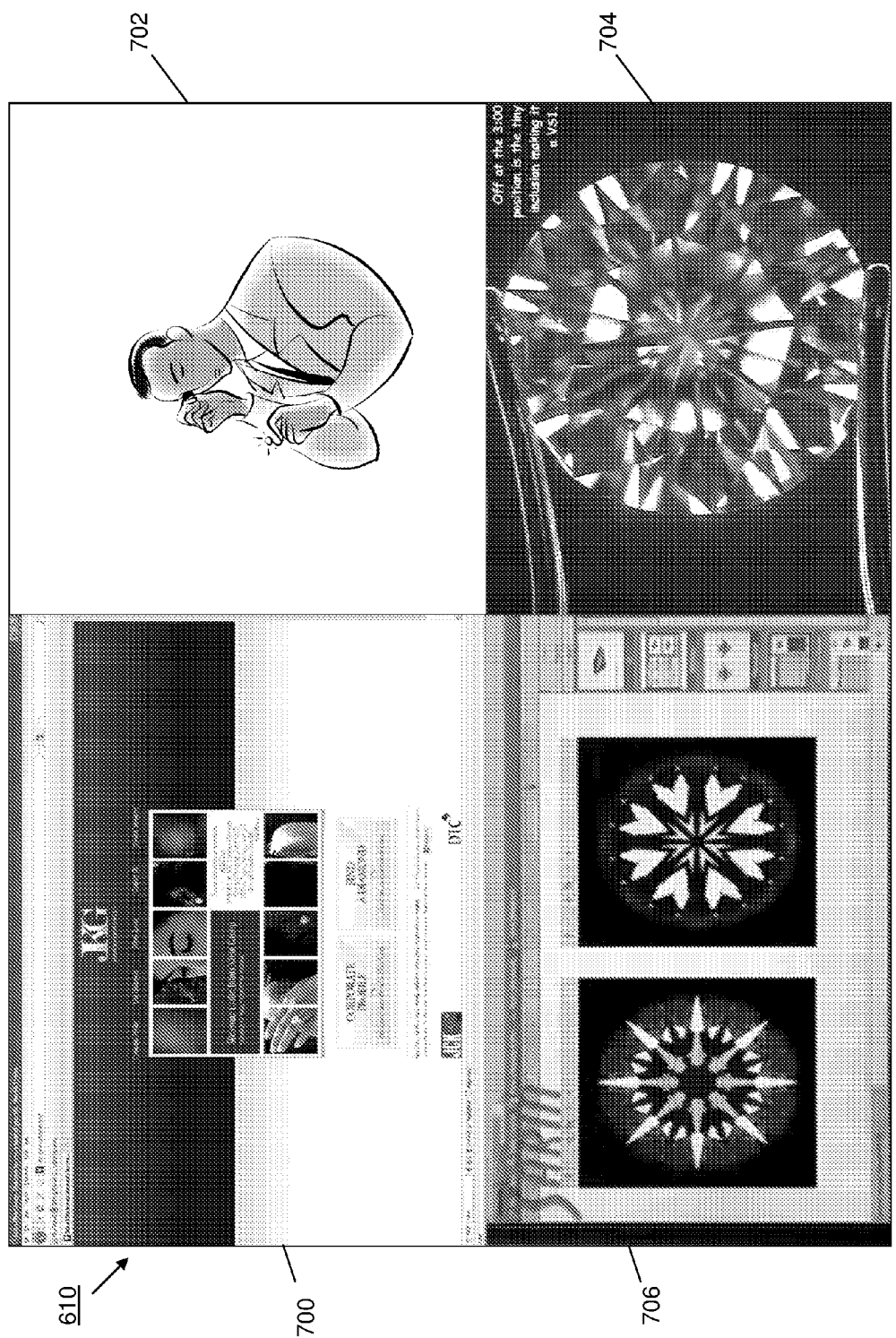
FIG. 7d illustrates an exemplary example of the customer's monitor during an interactive communication session.

FIGS. 7c and 7d illustrate how the screen on the customer's monitor 610 may look after receiving the test results. In FIG. 7c, video box 706 displays the view of a diamond during a Hearts & Arrows test. Video box 704 of the microscope and video box 702 of the jewelry consultant also are displayed on the screen, although in a minimized capacity. Website 700 remains in the background. In at least one embodiment, the customer may toggle between each of the applications (e.g. website 700, video box 702, video box 704, video box 706). The toggling may occurred via a "Tab" button, or the toggling may occur through the clicking of a mouse or other means.

FIG. 7d illustrates a different view of the screen on customer's monitor 610. Here, the screen is partitioned in various sections. Each of the sections is devoted to a particular application, such as website 700, video box 702, video box 704, video box 706. In at least one embodiment, the addition of an application results in a new video box being added to the screen.

In at least one embodiment, the tests are performed by technicians in advance of the interactive communication session. If the customer requests information from any of theses tests, the jewelry consultant retrieves the test results from a database and electronically sends the test results to the customer.

In another embodiment, the tests are being performed by off-site technicians in tandem with the interactive communication session. If a customer requests information from any of these tests, the jewelry consultant will submit a request for the test results. Once the tests are completed, the technical will electronically send the test results to both the jewelry consultant workstation 612 and the customer's client terminal 600.

A. Quality-Related Tests

As described above, quality-related tests may be performed during the interactive communication session. In at least one embodiment, the jewelry consultant may wish to demonstrate the quality of a diamond's cut.

For example, the jewelry consultant places the diamond under an Ideal-scope. The Ideal-scope uses a lens with a hot red/pink reflector that is positioned in front of the diamond under a central viewing hole. The viewer is able to see how much of the red/pink light refracts back from the diamond. The resulting pattern will provide an indication of the facet proportion and symmetry. Thus, the Ideal-scope is used to gauge the brilliance of a diamond. The white areas in a diamond show light transmitted from behind the diamond (or leakage). The blackness of the lens mimics an observer's head blocking out the light. Generally, the most brilliant diamonds look bright pink/red with a black star and minimal white or pale areas. For example, a diamond with perfect symmetry and good proportions will show a black eight-pointed star.

In another example, the jewelry consultant tests the cut quality of the diamond through an ASET (Angular Spectrum Evaluation Tool) test. The ASET may either be a desktop or a handheld device. Similar to the Ideal-scope, the ASET test is used to demonstrate the light performance of a diamond. However, unlike the Ideal-scope, the ASET uses a tri-color filter that gives light being reflected at different angles a different color. As a result, the ASET device provides a color-coded map of light usage by a diamond.

For example, in the generated ASET image, blue areas are the dark contrast areas observed in a diamond due of obscuration (e.g., a head in the way). In ASET the configuration is intended to represent light coming from 75 degrees to 90 degrees. In the AGS metric, a well-made round brilliant diamond should have about 18% blue content. Red represents the most desirable color in the image. The red color is intended to be light coming from 45 degrees to 75 degrees—it is not obscured so it is producing the brightness via the most direct light. Green light comes from the horizon to 45 degrees, and is usually reflected light and of lower quality. Black (or white if using white backlighting) areas in the diamond represent areas of non-reflection or leakage.

As shown in FIG. 7c, in at least one embodiment, the image generated by testing with an ASET device automatically appears on the customer's monitor screen 610. The jewelry consultant may then send an electronic copy of the ASET image over communication channel 602 to the customer's client terminal 600. In another embodiment, both the jewelry consultant and customer receive at their respective terminals, 612 and 610, the ASET image from a third party. In yet another example, only the jewelry consultant has receive the ASET test results, and the jewelry consultant electronically sends the results to the customer's terminal 612 over communications channel 602.

In at least one embodiment, the quality-related test is a "Hearts and Arrows" test. The term "Hearts & Arrows" is a description used by the diamond industry to refer to diamonds that exhibit a crisp and complete pattern of hearts and arrows under certain lighting conditions. The Hearts & Arrows test can be used to demonstrate a high quality of a cut and the polish of a diamond. Often, in order to create an optimum Hearts & Arrows effect in a diamond, a diamond cutter must be willing to sacrifice expensive rough diamond material (i.e., lose significant percentage of costly rough stone) to yield a smaller diamond of superior quality. Due to the complexity of the cut that is required to generate a Hearts & Arrows diamond, these diamonds cost more to produce than standard round cut diamonds.

In at least one embodiment, the jewelry consultant places the selected diamond underneath a Hearts & Arrows viewer.

If all the facets of the diamond are precisely aligned under the viewer, then the Hearts & Arrows effect is clearly displayed. When the diamond is viewed the top (or the table of the diamond), an effect of arrows should be seen. When the diamond is viewed from the bottom (or pavilion of the diamond), an effect of hearts should be seen. A high quality Hearts & Arrows diamond exhibits a pattern that is vivid, symmetrical and clearly formed. On the other hand, diamonds with less than ideal cuts will display only a partial pattern underneath the viewer, or an otherwise less well-defined "hearts and arrows" pattern. Less than ideal diamonds also may exhibit a pattern that is not crisp and sharp. These diamonds also may depict hearts and arrows of differing, asymmetrical sizes.

In at least one embodiment, a video camera is attached to the Hearts & Arrows viewer. Images generated from the Hearts & Arrows viewer are transmitted over communication channel 602 and displayed on monitor 610 at client terminal 600. Thus, the customer is able to remotely view and evaluate for himself the quality of the Hearts & Arrows pattern of a particular diamond.

In another embodiment, in response to a request submitted by the customer before or during a communication session, the jewelry consultant places the diamond in a measurement system, such as the Sarin DiaScan S+™. The measurement system generates a plurality of electronic test results, among which include a copy of the Hearts & Arrows pattern. The jewelry consultant may then send an electronic copy of the Hearts & Arrows pattern over communication channel 602 to the customer's client terminal 600.

During the interactive communication session, the jewelry consultant also may test the color and fluorescence of the diamond. In at least one embodiment, the diamond is placed under a light performance analyzer. Using high-tech algorithms, the light performance analyzer calculates the color of the diamond and measures its fluorescence. The jewelry consultant may use the light performance analyzer to demonstrate and compare the color quality of the selected diamonds.

For example, a customer may wish to purchase a "near colorless" diamond, rather than a "colorless" diamond. However, the customer may be concerned about his fiancée detecting the difference. To reassure the customer, the jewelry consultant may provide the customer with a side-by-side comparison of a colorless diamond and near colorless diamond. The customer may watch, via monitor 610, the jewelry consultant perform the test on each stone. As such, the jewelry consultant demonstrates that despite the color grade difference, it is near impossible to determine the actual difference by the naked eye. The customer is able to confirm this assessment via monitor 610 as well. Some example of diamond light performance analyzers are the Sarin Colibri™ device or OGI MegaFire device.

In at least one embodiment, the jewelry consultant performs a color-quality test using a device called the Zvi Yehuda Colorimeter. The Yehuda colorimeter may be used alone, or it can be connected to a portable rough analyzer, such as the OGI Tender device.

In some embodiments, the customer may request a test or lighting conditions to demonstrate any fluorescence of a gem such as a diamond. In response, the gemologist may cause an ultraviolet light source such as a black light to be shined on the diamond to demonstrate its fluorescence, which may be displayed via video feed to the customer. Such fluorescence may be demonstrated with reference to one or more reference gemstones, such as similar sized diamonds having no, light, medium, and strong blue fluorescence.

Another quality-related test evaluates the quality of a diamond's cut and proportion. In at least one embodiment, the diamond is placed under a diamond proportion analyzer, which generates a variety of reports about the diamond's proportions. The reports may contain information about the diamond's weight, diameter, depth, crown angle, crown height, pavilion angle, pavilion height, cutlet size, culet off center, table size, table off center, stars, lower girdle and upper girdle.

In at least one embodiment, the quality-related tests are conducted by a comprehensive measurement system. The measurement system is capable of administering multiple quality-related tests. For example, the Sarin DiaScan S+™ is a device that performed a combination of the above-described tests. The DiaScan device demonstrates the proportion of the diamond and provides a complete three dimensional profile of the diamond. The device also provides a cut grading report for the diamond. Additionally, the device provides a photorealistic view of the Hearts & Arrows pattern as well.

In some embodiments, a customer may request cut score measurements based on the "Holloway Cut Advisor" (see, e.g., U.S. Pat. No. 7,251,619) based on various measurements of a diamond, such as crown angle and pavilion angle. Such score may be calculated, and the Holloway Cut Advisor information may be provided to the customer.

In at least one embodiment, the test results from any of the above-described tests are simultaneously displayed on the jewelry consultant's monitor 614 and the customer's monitor 610. In another embodiment, the jewelry consultant obtains an electronic copy of the test results and sends the electronic copy over communications channel 402 to client terminal 600.

B. Authenticity-Related Tests

In addition to quality-related tests, the jewelry consultant also may conduct tests that confirm the authenticity of a selected diamond.

In at least one embodiment, the jewelry consultant uses an electronic thermal probe to test the thermal conductivity of a diamond. Since real diamonds possess superlative thermal conductivity, the thermal probe allows the jewelry consultants to distinguish a real diamond from various imitators, such as Cubic Zirconia (CZ).

In some embodiments, the thermal probes consist of a pair of battery-powered thermistors mounted in a fine copper tip. One of the thermistors functions as a heating device while the other thermistor measures the temperature of the copper tip. If the stone being tested is a diamond, the thermal probe will conduct the tip's thermal energy rapidly enough to produce a measurable temperature drop. On the other hand, because many imitation diamonds, such as CZ, are thermal insulators, these imitators will fail to conduct the thermistor's heat.

In at least one embodiment, the thermal probes are highly sensitive and thus capable of distinguishing between a diamond and Moissanite (an imitation diamond stimulant that has a thermal conductivity similar to a diamond). The thermal probe also may have enough sensitivity to distinguish whether an imitator has been coated with a nano diamond coating, which is an extremely thin layer of diamond material.

Another authenticity-related test is conducted by a refractometer. The jewelry consultant uses a refractometer to determine the type of mineral or gem. The refractometer precisely measures a gemstone's refractive index (RI) and compares the RI number with the inherent refractive index of the mineral. For example, a jewelry consultant may use a refractometer to distinguish between a colorless sapphire (low RI) and a diamond (high RI) by comparing the refractive indices generated by the refractometer.

In at least one embodiment, the jewelry consultant also uses a Gemeter (or Jemeter) to measure the refractive index of faceted gemstones. The Gemeter uses a laser-like beam of radiation to reflect off of a facet of the gemstone. The top layers of atoms are scanned by placing the facet directly over the examination disc. The jewelry consultant evaluates the generated RI in order to distinguish a diamond from an imitation stone.

In at least one embodiment, a video camera is attached to the Ideal-scope, so that video images of the gemstone under the Ideal-scope are transmitted to the customer's monitor 610. Thus, the customer at client terminal 600 is able to view the resulting pattern and evaluate firsthand the refraction of the red/pink light from the diamond.

In at least another embodiment, the jewelry consultant uses a polariscope to test the gemstone of interest. The polariscope uses two polarizing filters orientated at right angles to each other. The gemstone is placed between the two polarizing filters. The polariscope also may have a built-in light source underneath the bottom filter. A jewelry consultant uses the polariscope to evaluate whether a gemstone is single refracting, such as a diamond, or double refracting, such as a CZ or Moissanite. In at least one embodiment, the jewelry consultant uses the polariscope to detect any stresses with in the gemstone's materials.

In at least one embodiment, the jewelry consultant uses a spectroscope to test the gemstone. The spectroscope is used to determine whether a gemstone is made from a natural material or a synthetic material. Spectroscopes generally use high-dispersion diffraction grating film, movable slits, and a photodetector to measure the properties of light within a specific portion of the spectrum. Each natural and synthetic mineral has a unique spectral "signature" that can be identified when compared to a full spectrum Fraunhofer chart. As such, the level of absorption and/or transmission from a full spectrum light source that passes through the crystal will identify subtle variations in chemical composition.

In at least one embodiment, the jewelry consultant uses a Raman Imaging Spectrometer, which is a sophisticated testing device that can be used to identify inclusions in a gemstone. The Raman Imaging Spectrometer also can determine whether a diamond is a synthetic diamond that has been grown or created in a laboratory. For example, the Raman Imaging Spectrometer can determine whether the diamond is a laboratory-created High Pressure High Temperature (HPHT) diamond. The Raman Imagine Spectrometer also can detect the presence of any artificial resin in a gemstone, such as emerald fillers.

In at least one embodiment, the jewelry consultant uses a Chelsea filter to test the gemstone. The Chelsea filter also may be referred to as an "emerald filter" or "color filter." The Chelsea filer is a gemological dichromatic filter that can help separate some natural gemstones from their synthetic counterparts. The Chelsea filter absorbs visible light with the exception of long red wavelengths, which are transmitted through the filter causing some minerals to change color. The change of color in the gemstone is due to the absorption and transmission of different wavelengths of full-spectrum white light. For example, the "green" of an emerald is created from a combination of different wavelengths that can help distinguish chromium-colored (natural) emeralds from emerald imitations, which are often colored by elements other than chromium. A natural emerald that is colored by chromium will appear as pink or red in the Chelsea Filter. On the other hand, transparent blue stones that appear pink or dirty red under a Chelsea filter should be suspected of enhancement treatments using chromium.

In at least one embodiment, the jewelry consultant uses a magnification lens, such as a darkfield diamond viewer to test the gemstone. A darkfield diamond viewer is a portable "darkfield" 10× loupe for inspecting diamonds and other gemstones. Using darkfield illumination, a gemologist can detect fracture-filled stones, or diamonds that have undergone clarity enhancement. The process of fracture-filling involves filling cracks in diamonds with molten glass to improve their clarity. Because only thin glass film is used, the color or weight of the diamond is usually unaffected. As a result, a fracture-filled diamond can be easily overlooked by the naked eye. Thus, the jewelry consultant may use the darkfield diamond viewer to determine whether a diamond emits flashes of color (or the "flash effect"). The jewelry consultants also may use the darkfield diamond viewer to help detect small inclusions in a gemstone.

In at least one embodiment, the jewelry consultant uses a scale to measure the weight of a finished jewelry piece and/or a gemstone. The scale may be a digital electronic scale and may employ weight units in grams, ounces or carats.

In at least one embodiment, the jewelry consultant measures the specific gravity of a gemstone. One process for testing the specific gravity may involve using heavy liquids or hydrostatic weighing Specific gravity (SG), is a measurement of the relative density of a gem or mineral. Relative density is a comparative scale of how tightly the atoms are grouped in a given material. Using heavy liquids to measure specific gravity starts with several containers of different liquid solutions, each with gradually increasing density. A gemstone will sink, float, or rise to the surface depending on its specific gravity in relation to the liquid.

V. Designing Customized Ring Setting

Once the customer has selected a diamond to purchase, he has the option of creating a customized setting for the diamond.

Figure 8A:
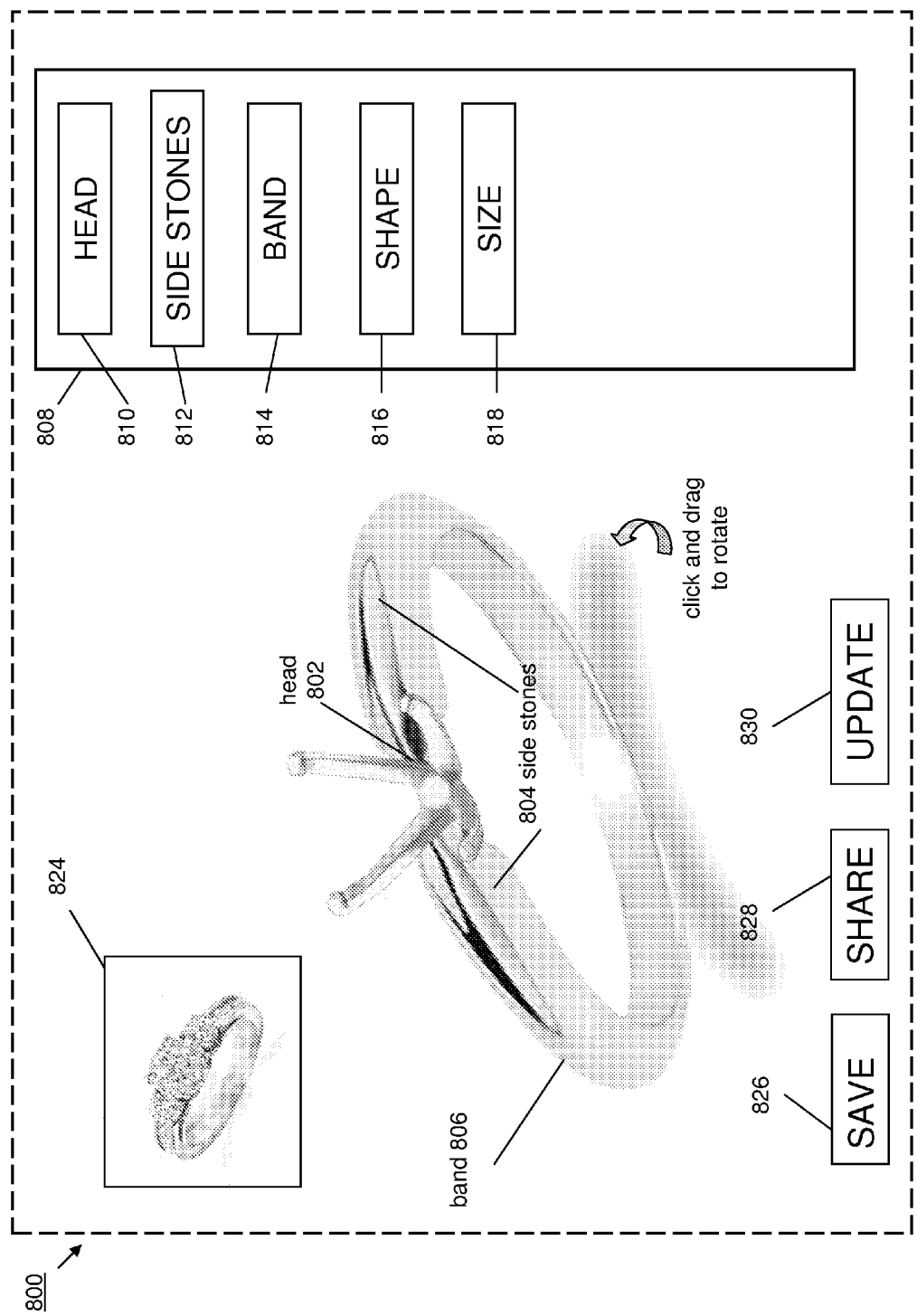
FIG. 8a illustrates an exemplary example of the interactive design tool.

FIG. 8*a* illustrates an exemplary example of interactive design tool 800 for designing a customized ring setting. Although the exemplary example illustrates the customization of a ring setting, interactive design tool 800 may be applied to any piece of jewelry item. For example, interactive design tool 800 may be used to design a bracelet, a necklace, a pendant, and a brooch.

Referring back to FIG. 8*a*, interactive design tool 800 comprises design template 846, which is a customizable image of the jewelry piece. In the exemplary example, design template 846 shows an image of a ring setting. As shown in FIG. 8*a*, interactive design tool 800 allows customers to select and change various components of the ring, such as head 802, side stones 804 and band 806.

Figure 8B:
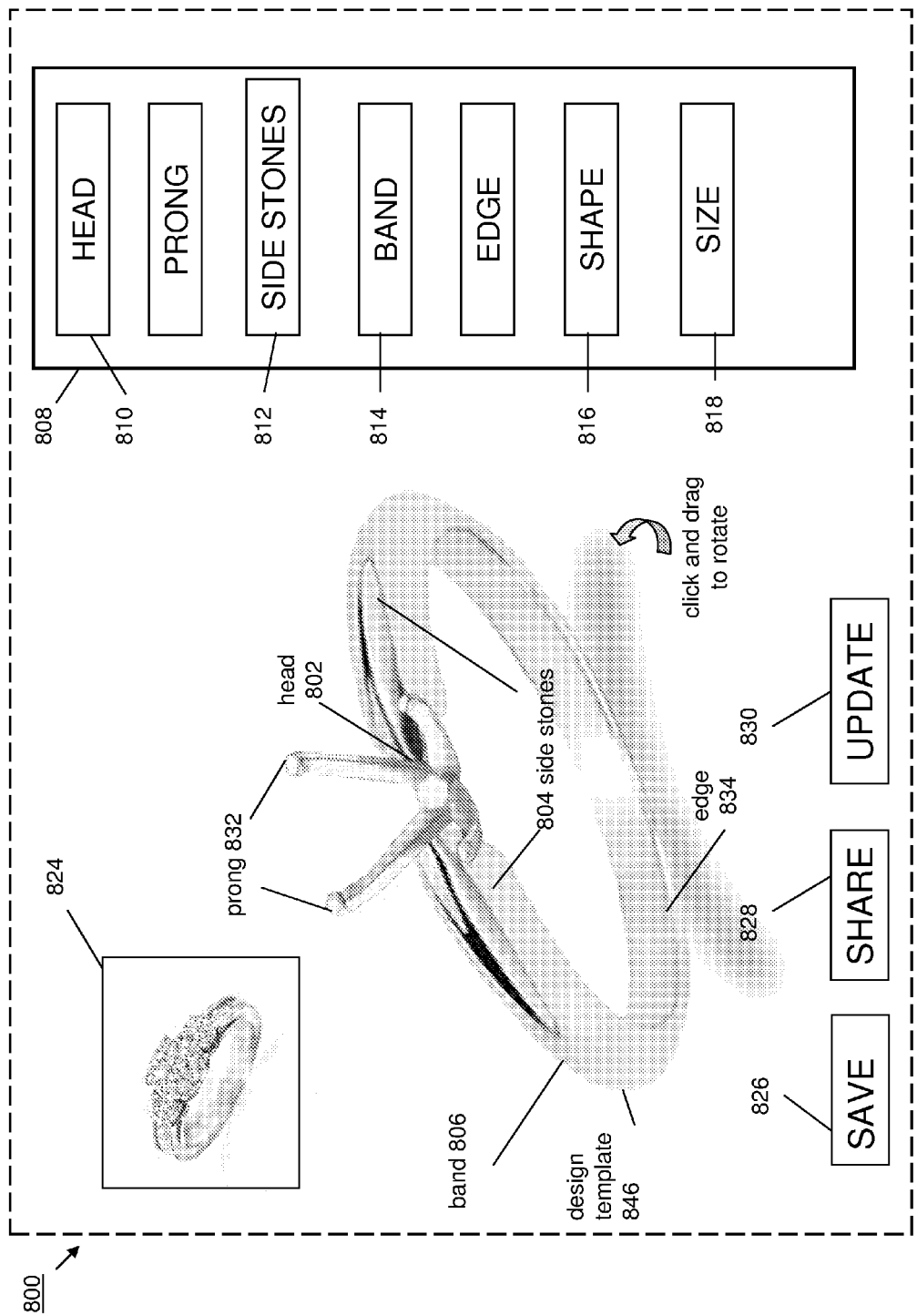
FIG. 8b illustrates an exemplary example of the interactive design tool.

FIG. 8*b* illustrates another example of interactive design tool 800. In FIG. 8*b*, interactive design tool 800 provides additional customization features to the user. For example, the customer may highlight and customize prong 832 and edge 834.

Interactive design tool 800 also comprises toolbar 808 that offer the available option choices for each ring component. Toolbar 808 comprises tab 810-818 which represent the categories of the available option choices. Tabs 810-812 are directed at the various components of the ring setting. Tab 816 is directed the available shape choices for a diamond. For example, the customer may use interactive design tool 800 in the beginning of his diamond search in order to decide which shape of diamond to purchase. Toolbar 808 also comprises tab 818 for inputting the size of the ring band.

When a customer clicks on one of tabs 810-818, toolbar 800 expands to display a plurality of option choices related to the selected tab category. For example, the customer may select tab 812 for the category of side stones. In return, tool bar 808 expands to offer a plurality of choices, such as a pave setting, a channel setting, a baguette setting, a preset setting, and a three-stone ring setting. In at least one embodiment, the side stones may take on any number of shapes. Some example shapes may include: Asscher cut, baguillion cut, barocut, briolette cut, corona cut, crosscut cut, cushion cut, Czar cut, flanders square cut, grace cut, half moon cut, heart-shaped cut, Marquise cut, radiant cut, oval cut, pear-shaped cut, princess cut, quadrillion cut, regent cut, trillion cut, virtue cut or round cut.

Figure 8C:
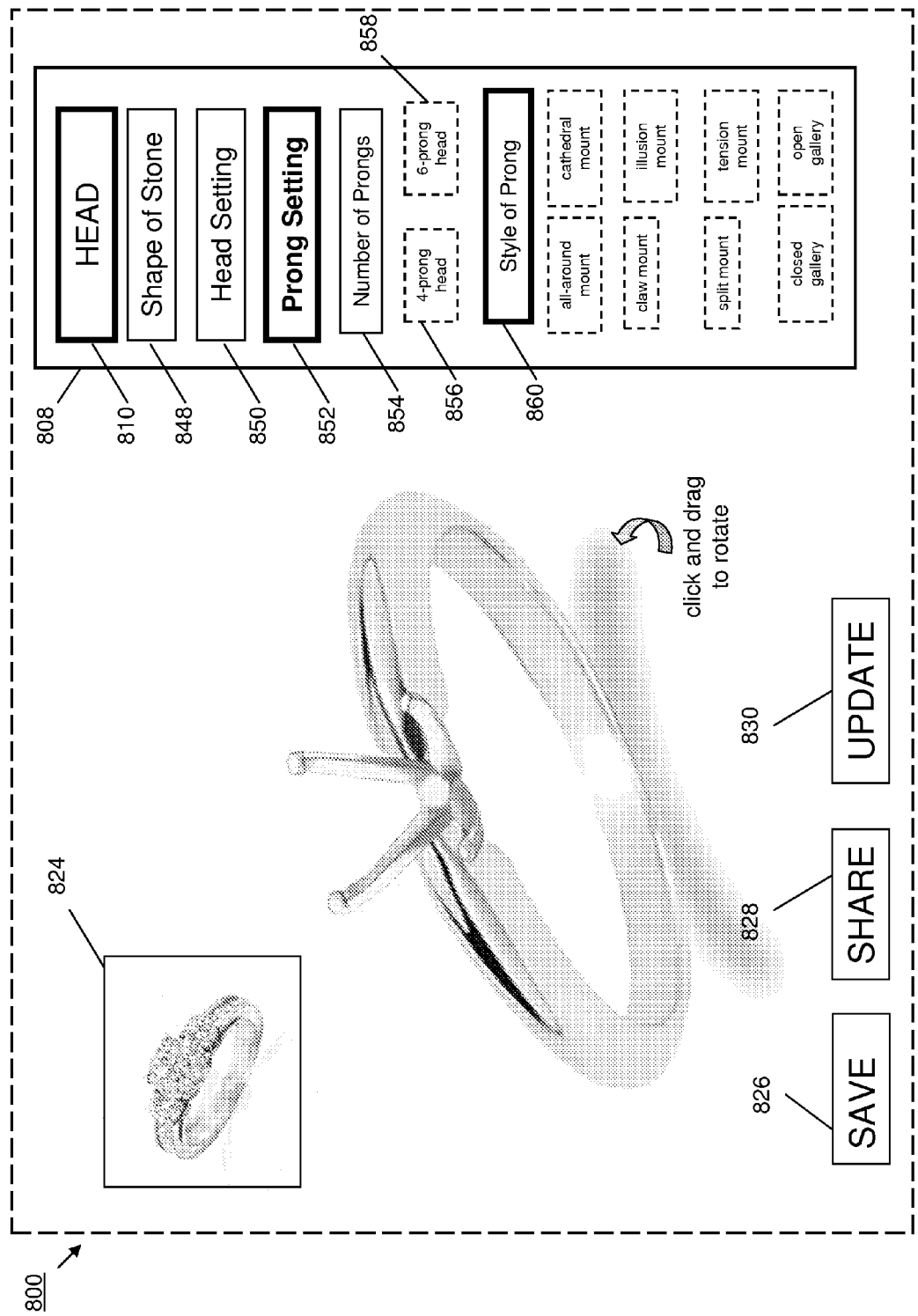
FIG. 8c illustrates an exemplary example of the interactive design tool, after the user action of selecting the tab for "head".

In at least one embodiment, each of tab categories 810-818 expands into subcategories. Each subcategory may be directed at an option choice for the ring setting. In at least one embodiment, each subcategory is capable of being expanded into additional subcategories. For example, as shown in FIG. 8c, the customer selects tab 810 for the category of ring head. Toolbar 808 expands into the subcategories of shape of stone 848, head setting 850, and prong setting 852. If the customer selects prong setting tab 852, then toolbar 808 expands further into subcategories of number of prongs 854 or style of prong 860. Selecting tab 854 for number of prong results in toolbar 808 further expanding into choices of a 4-prong mount or a 6-prong mount.

Figure 8D:
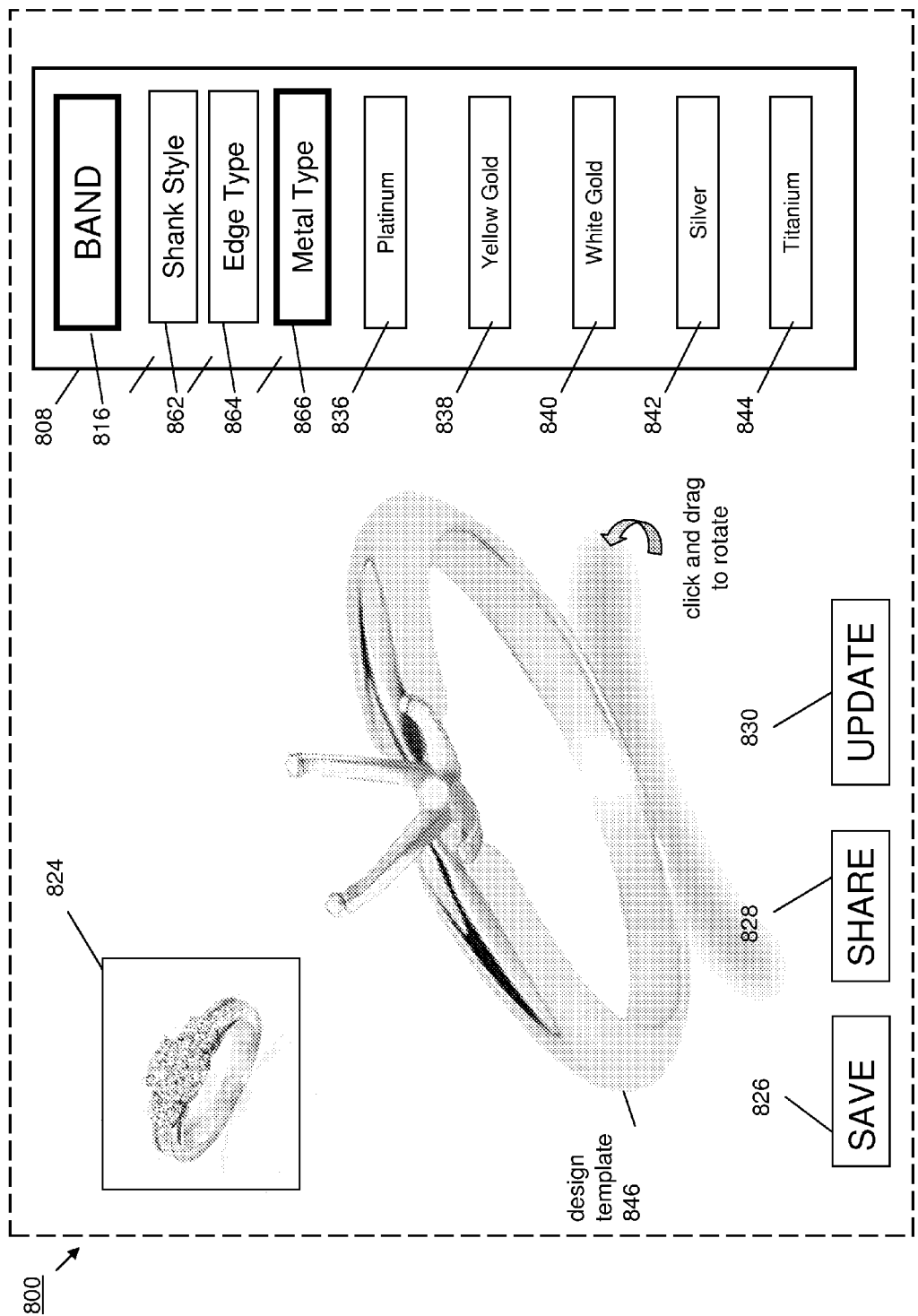
FIG. 8d illustrates an exemplary example of the interactive design tool, after the user action of selecting the tab for "band".

In at least one embodiment, the customer places a cursor over the section of the ring setting that he wishes to customize Interactive design tool 800 then highlights the selected section of the ring. Tool bar 812 also displays the available options for the highlighted section of the ring. As shown in FIG. 8d, the customer highlights band 806 for the ring. Toolbar 808 then displays tabs 862-866 which correspond to subcategories shank style, edge type and metal type. If the customer selects tab 866 for metal type, then tool bar 808 displays the options for the available metal types for the band. Tabs 836-844 correspond to the choices of a platinum band, a white gold band, a yellow gold band, a silver band and a titanium band. The customer selects an option by clicking on corresponding tabs 836-844.

For example, the customer may select platinum tab 836. In response, interactive design tool 800 automatically updates band 806 on design template 846 to reflect the selection of platinum. If the customer then clicks yellow gold tab 838, then interactive design tool 800 automatically changes band 806 to be yellow gold. The customer may choose to quickly click through each of the available choices in toolbar 808 before making his final selection. Once the customer has decided on a metal type for band 806, he then clicks update button 830, which updates the image pictured in preview box 824.

In at least one embodiment, the customer select tab 862 for shank style. Toolbar 808 expands to display a variety of options for the shank, or the part of the ring that encircles the finger. Some options for shank style may include a rounded style or a European (square) style.

In at least one embodiment, the customer selects tab 864 for edge type. Toolbar 808 expands to display a variety of options for the edge of the ring band. Some options for edge style may include a half round edge, a square edge, a knife edge or a comfort fit edge.

Figure 8E:
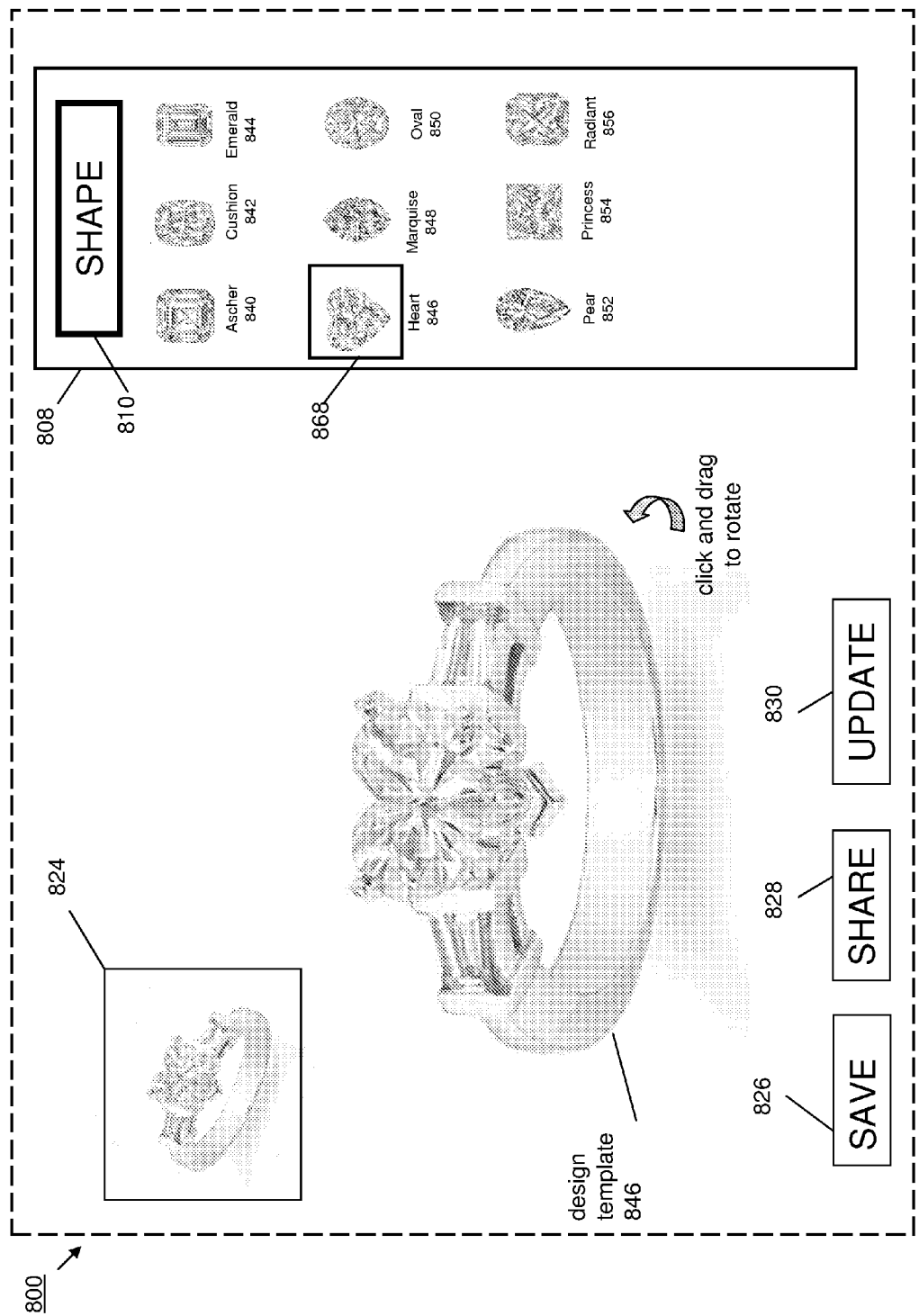
FIG. 8e illustrates an exemplary example of the interactive design tool, after the user action of selecting the tab for "shape".

Referring back to FIG. 8a, the customer also may make changes to design template 846 by clicking on correspond-ing tabs 810-818. When the customer selects a tab, toolbar 808 expands to display the available options for the selected tab. FIG. 8d illustrates an exemplary example of a customer selecting shape tab 816. In response to the customer's selection of shape tab 816, toolbar 808 expands to display the available diamond shapes. In the example illustrated in FIG. 8e, the customer selects heart-shaped diamond 868. Design template 846 is automatically updated to display the heart-shaped diamond. Once the customer selects update button 830, interactive design tool 800 updates the image in previous box 824.

In at least one embodiment, the customer may rotate design template 846 in a 360 degree view. The customer clicks on design template 846 and drags the mouse around in order to cause design template 846 to rotate about an axis. The "click and drag" function allows the customer to view design template 846 from a variety of different angles.

In at least one embodiment, interactive design tool 800 displays design template 846 in four different views: top view, bottom view and side views. Buttons correspond to each view is present on interactive design tool 800. By selecting the corresponding button, the customer can toggle between each of the views available for design template 846.

After the customer finishes designing the ring setting, he has several options on how to proceed. In at least one embodiment, the customer selects save button 826 which saves the most recent image of preview box 824. The image may be stored in the database of the website, or the image may be saved locally at the customer's location. In another embodiment, the customer selects share button 828 which allows him to share the image of preview box 824 with another person. In at least one embodiment, interactive design tool 800 displays an electronic submission box in response to the selection of share button 828. The customer inputs an e-mail address for the intended recipient. The customer also may include a message in the electronic submission box. The website then sends an electronic message to the recipient with either the designed image, or the website may send a link to the designed image.

In at least one embodiment, in response to the selection of share button 828, interactive design tool 800 provides the customer with an option of posting either an image of the designed ring setting or a link to the designed image to variety of social media sites, such as Facebook, Twitter and Blogger.

At any point during the design process, the customer may request a live interactive communication session with a jewelry designer. Similar to the process previously described for scheduling an interactive communication session with a live jewelry consultant, the customer submits a request for an interactive communication session with a jewelry designer. The customer's request is routed through communication channel 602 to request handling system 604.

In one embodiment, request handling system 604 randomly assigns the customer to a first available jewelry designer. In another embodiment, the customer specifies a particular designer for the interactive communication session. The customer may include the name of the designer in the request that is submitted to request handling system 604. For example, the customer may have developed a positive working experience with a particular jewelry designer. Thus, the customer may wish to continue working with this same designer. In another example, the customer may wish to specify a particular jewelry designer based on a personal reference or recommendation.

In at least one embodiment, the customer selects a jewelry designer based on the jewelry consultant's public profile, which is displayed on the website. The public profile may include a photograph of the designer and a biography of the designer's background. The biography may include educational background, relevant work experiences and a sample portfolio of his or her work.

In at least one embodiment, the website allows previous customers to write a review for each jewelry designer. Similar to the review and ranking system for jewelry consultants, the website allows previous customers to rank each designer. The reviews and rankings may be published on the website next to each jewelry designer's profiles. In one example, the customer selects a jewelry designer based on the ranking and reviews posted.

As shown in FIG. 6, request handling system 604 identifies a jewelry designer for the customer. Request handling system 604 then sends the request to the jewelry's workstation 626. In at least one embodiment, the jewelry designer may accept the request by clicking on a button or a link to indicate that he is available for the requested date and time of the interactive communication session. Designer workstation 626 then transmits an indication of the jewelry consultant's acceptance back to request handling system 604. In response, request handling system 604 generates an interactive communication session between client terminal 600 and designer workstation 626 at the requested date and time.

In at least one embodiment, the interactive communication session is a three-way video conference with the customer, jewelry designer and jewelry consultant. Together, the jewelry designer and the jewelry consultant help the customer selected a gemstone and create a setting. In at least one embodiment, request handling system 604 does not need to generate an interactive communication session between the customer and the jewelry designer. Rather, the jewelry consultant selects a conference button that connects the jewelry designer into the existing interactive communication session.

In another embodiment, the jewelry designer merely takes over the jewelry consultant's place at workstation 612. No new interactive communication session is necessary. The customer continues discussions with the jewelry designer on the existing interactive communication session. In at least one embodiment, the jewelry consultant is the jewelry designer.

In at least one embodiment, the customer uploads an image of a desired setting. Client terminal 600 transmits the uploaded image over communication channel 602 to jewelry designer workstation 626. The jewelry designer analyzes the uploaded image. In one embodiment, the designer attempts to locate a pre-designed setting that matches the uploaded image. In another example, the designer attempts to recreate the uploaded image. Still in another example, the jewelry designer and customer discussion the uploaded image over the interactive communication session. The jewelry designer may break down various components of the uploaded image and discuss the various options for replication. In at least one embodiment, the customer uploads multiple images and specifies which components of each image that he wishes to analyze.

For example, the customer may submit several images of celebrity engagement ring. The customer may indicate that he likes the shape of the diamond in one ring setting and wishes to incorporate the side stones of another image. The jewelry designer would analyze the uploaded image and determine the various components that can be emulated. The designer may determine that customer likes the heart-shaped diamond and a baguette style side stone. As such, the jewelry designer will work with the customer in designing a unique ring setting that incorporates the traits of a heart-shaped diamond and baguette-style side stones.

In at least one embodiment, the uploaded image is analyzed by image-recognition software. The image-recognition software determines the various components of the uploaded image that are capable of being emulated.

In at least one embodiment, the customer selects a pre-designed setting from a gallery of pre-designed settings, and uses the pre-designed setting as his customized setting.

In at least one embodiment, the customer reviews a gallery of pre-designed settings and uses a pre-designed setting for a portion of his customized setting.

VI. Other Embodiments

A. A method comprising: receiving, via a processor, a request from a remote device to communicate with a jewelry consultant concerning at least one jewelry item, in which the processor and the remote device are in electronic communication via a network; generating, via the processor in response to the request, an interactive communication session between the jewelry consultant and the remote device, in which the interactive communication session transmits live video images of the jewelry consultant and the at least one jewelry item to the remote device; applying, via the processor, at least one test on the at least one jewelry item; and transmitting, via the processor, a test result that is generated from applying the at least one test on the at least one jewelry item.

A.1. The method of claim A further comprising: receiving live video images of a customer from the remote device. A.2. The method of claim A, in which the video images are captured via at least one of: a video camera; and a webcam. A.3. The method of claim A further comprising: transmitting the request to communicate to the jewelry consultant, in which the request to communicate comprises a proposed date and a proposed time for the interactive communication session. A.4. The method of claim A.3. further comprising: receiving an acceptance of the request to communicate; and transmitting an indication of the acceptance to the remote device. A.5. The method of claim A.3. further comprising: receiving a decline of the request to communicate; and transmitting an indication of the decline to the remote device. A.6. The method of claim A.5. further comprising: receiving an alternative time and an alternative date for the interactive communication session. A.7. The method of claim A.6., in which the alternative time and the alternative date are submitted by the jewelry consultant. A.8. The method of claim A.6., in which the alternative time and the alternative date are submitted by the remote device. A.9. The method of claim A further comprising: receiving at least one desired criterion for the jewelry consultant; and selecting the jewelry consultant for the interactive communication session, in which the jewelry consultant matches the at least one desired criterion. A.10. The method of claim A.9., in which the at least one desired criterion comprises at least one of: a gender, an educational background, a certification, a license, a level of experience, a sales number, a quantity of positive reviews and a quantity of negative reviews. A.11. The method of claim A further comprising: selecting the jewelry consultant from a plurality of jewelry consultants. A.1.2 The method of claim A, which the jewelry consultant is at least one of: a certified gemologist; and a salesperson. A.13. The method of claim A further comprising: receiving a request to communicate with a specific jewelry consultant, in which the specific jewelry consultant is selected from a plurality of jewelry consultants.

A.14. The method of claim A.13., in which each of the plurality of jewelry consultants has a biography that is viewable online; and in which the specific jewelry consultant is selected based at least on the biography of the specific jewelry consultant. A.15. The method of claim A.14., in which the biography comprises at least one review concerning the specific jewelry consultant, in which the at least one review is written by a previous customer. A.16. The method of claim A.14., in which the biography comprises a ranking of the specific jewelry consultant in comparison to the plurality of jewelry consultants. A.17. The method of claim A further comprising: receiving at least one undesired criterion for the jewelry consultant; and selecting the jewelry consultant for the interactive communication session, in which the jewelry consultant does not possess the at least one undesired criterion. A.18. The method of claim A. further comprising: receiving at least one blacklisted jewelry consultant; and selecting the jewelry consultant from a plurality of jewelry consultants, in which the plurality of jewelry consultant does not comprise the at least one blacklisted jewelry consultant.

A.19. The method of claim A. further comprising: causing a display device to display the at least one jewelry item under a microscope, in which the microscope outputs at least one magnified image of the at least one jewelry item; and transmitting the at least one magnified image of the at least one jewelry item to the remote device. A.20. The method of claim A.19., in which the microscope is capable of receiving input information from the remote device. A.21. The method of claim A.20. further comprising: receiving an instruction from the remote device to generate a magnified image of the at least one jewelry item; and transmitting the magnified image of the at least one jewelry item to the remote device. A.22. The method of claim A.19., in which a video camera is attached to the microscope.

A.23. The method of claim A. further comprising: receiving a request to compare the at least one jewelry item with a benchmark object; and transmitting video images of the at least one jewelry item and the benchmark object to the remote device. A.24. The method of claim A.23., in which the benchmark object comprises a model's hand. A.25. The method of claim A.24, in which the model's hand is available in a plurality of sizes. A.26. The method of claim A.24, in which the model's hand is available in a plurality of skin tones. A.27. The method of claim A.24, in which the model's hand is available in either male form or female form. A.28. The method of claim A.24, in which the model's hand is available in either child form or adult form.

A.28. The method of claim A further comprising: receiving a request to provide a side-by-side comparison of at least two jewelry items; and transmitting video images of the side-by-side comparison to the remote device. A.29. The method of claim A.28., in which the at least two jewelry items are diamonds that share at least one of: a same cut, a same color, a same clarity, a same carat size and a same cost. A.30. The method of claim A.29., in which the at least two jewelry items are diamonds that share a same cut, a same color, a same clarity and a same carat size. A.31. The method of claim A.28., in which the least two jewelry items are diamonds that differ on at least one of: a cut, a color, a clarity, a carat size and a cost.

A.32. The method of claim A, in which the at least one test comprises at least one of: a quality-related tests; and an authenticity-related test. A.33. The method of claim A, in which the at least one test comprises an ASET test; and the method further comprising: generating an ASET image in response to application of the ASET test on the at least one jewelry item; and transmitting the ASET image to the remote device. A.33. The method of claim A., in which the at least one test comprises a Hearts and Arrows test; and the method further comprising: generating a Hearts and Arrows image in response to application of the Hearts and Arrows test; and transmitting the Hearts and Arrows image to the remote device.

A.34. The method of claim A. further comprising: receiving a request to adjust a lighting that is being directed on the at least one jewelry item. A.35. The method of claim A.34., in which adjusting the lighting comprises: adjusting an intensity of the lighting. A.36. The method of claim A.35., in which adjusting the lighting comprises: adjusting a color of the lighting. A.37. The method of claim A.35., in which adjusting the lighting comprises: adjusting the type of lighting. A.38. The method of claim A.34., in which the lighting is capable of replicating a lighting of various times of day. A.35. The method of claim A.34, in which the lighting is capable of replicating a lighting of various environments.

A.36. The method of claim A further comprising: receiving a request to customize a setting for the at least one jewelry item. A.37. The method of claim A.36., in which the setting may be at least one of: a ring setting, an earring setting, and a pendant. A.38. The method of claim A.36. further comprising: receiving a request from a remote device to communicate with a jewelry designer; and generating, in response to the request, an interactive communication session between the jewelry designer and the remote device. A.39. The method of claim A further comprising: generating an interactive design tool for designing a customized setting, in which the interactive design tool comprises an electronic template of the customized setting and the customized setting comprises a plurality of sections; detecting a selection of a first section of the customized setting; providing at least two customizable options for the first section of the customized setting; receiving a selection of one of the at least two customizable options; and generating a representation of the selected one of the at least two customizable options on the electronic template. A.40. The method of claim A.39., in which detecting the selection of the first section of the customized setting comprises: detecting that a cursor over the first section of the customized setting. A.41. The method of claim A.39., in which the first section comprises a head of a ring; and the at least two customizable options for the head of the ring comprises at least two of: a shape of stone; a head setting; a prong setting; a quantity of prongs; and a type of prong. A.42. The method of claim A.41., in which the shape of stone comprises at least one of: an Asscher cut, a cushion cut, an emerald cut, a heart-shaped cut, a marquise cut, an oval cut, a pear cut, a princess cut, and a radiant cut. A.43. The method of claim A.41., in which the head setting comprises at least one of: a half-bezel head; and a full-bezel head. A.44. The method of claim A.41, in which the quantity of prongs comprises at least one of: a no-prong setting; a four-prong setting; and a six-prong setting. A.45. The method of claim A.41, in which the type of prong comprises at least one of: an all-around mount, a cathedral mount, a claw mount, an illusion mount, a split mount, a tension mount, a closed gallery mount, and an open gallery mount. A.46. The method of claim of A.39., in which the first section comprises a band of a ring; and the at least two customizable options for the band comprise at least two of: a type of metal; a shank style; a type of edge finish; a width of the shank; and a height of the shank. A.47. The method of claim A.46., in which the type of metal comprises one of: a platinum metal, a white gold metal, a yellow gold metal, a silver metal, and a titanium metal. A.48. The method of claim A.46., in which the shank style comprises at least one of: a rounded style and a European style. A.49. The method of claim A.46., in which the type of edge finish comprises at least one of: a half-round edge, a knife edge, a square edge and a comfort fit. A.50. The method of claim A.39., in which the first section comprises a side stone of a ring; and the at least two customizable options for the side stone comprise at least two of: an Asscher cut, a baguillion cut, a barocut, a briolette cut, a corona cut, a crosscut cut, a cushion cut, a Czar cut, a Flanders square cut, a grace cut, a half moon cut, a heart-shaped cut, a Marquise cut, a radiant cut, a oval cut, a pear-shaped cut, a princess cut, a quadrillion cut, a regent cut, a trillion cut, a virtue cut and a round cut. A.51. The method of claim A.50. in which the side stone comprises any gemstone that is available. A.52. The method of claim A.39. further comprising: receiving a request to rotate the customized setting in three dimensions. A.53. The method of claim A.52., in which the request to rotate the customized setting comprises: detecting a selection of a click-and-drag button located on the interactive design tool. A.54. The method of claim A.39. further comprising: receiving a request to rotate the customized setting along at least one of: a x-axis; a y-axis; and a z-axis. A.55. The method of claim A.39. further comprising: receiving a request to save the customized setting; and storing the saved customized setting in a database. A.56. The method of claim A.39. further comprising: receiving a request to send an electronic link of the customized setting, in which the request comprises an email address for a recipient of the electronic link; and transmitting an email with the electronic link to the email address. A.57. The method of claim A.39. further comprising: receiving a request to post an electronic link of the customized setting to a social network site, in which at least one individual may vote or comment on the posted customized setting. A.58. The method of claim A, in which the at least one jewelry item is a diamond and the diamond comprises a certificate that is viewable online. A.59. The method of claim A.58., in which the certificate is issued by one of: Gemological Institute of America (GIA), International Gemological Institute (IGI), American Gemological Society (AGS) or European Gemological Society (EGL).

A.60. An apparatus comprising: a processor that is connected via a network to: (i) a video camera for capturing a video file of a jewelry consultant and at least one jewelry item, and transmitting the video file via a live video stream to a video output located on a remote device; (ii) an audio input for capture a audio file of the jewelry consultant's voice and transmitting the sound file to an audio output located on the remote device; and a memory, in which the memory stores instructions which, when executed by the processor, direct the processor to perform the method of: receiving a request from the remote device to communicate with a jewelry consultant concerning at least one jewelry item; generating, in response to the request, an interactive communication session between the jewelry consultant and the remote device, in which the interactive communication session transmits live video images of the jewelry consultant and the at least one jewelry item to the remote device; applying at least one test on the at least one jewelry item; and transmitting a test result that is generated from applying the at least one test on the at least one jewelry item. A.61. The apparatus of claim A.60. further comprising: a microscope that outputs images of the at least one jewelry item and is capable of receiving instructions from the remote device.

A.62. An article of manufacture comprising: a storage medium, in which the storage medium stores instructions which, when executed by a processor, direct the processor to perform the method of: receiving a request from the remote device to communicate with a jewelry consultant concerning at least one jewelry item; generating, in response to the request, an interactive communication session between the jewelry consultant and the remote device, in which the interactive communication session transmits live video images of the jewelry consultant and the at least one jewelry item to the remote device; applying at least one test on the at least one jewelry item; and transmitting a test result that is generated from applying the at least one test on the at least one jewelry item.

B. A method comprising: viewing, via a processor, a plurality of jewelry items that are available for sale via an online webpage; transmitting, via the processor, a request to communicate with a jewelry consultant located at a remote device about at least one jewelry item, in which the processor and the remote device are in electronic communication via a network; receiving, via the processor in response to the request to communicate, an interactive communication session with the jewelry consultant, in which the interactive communication session transmits live video images of the jewelry consultant and the at least one jewelry item; transmitting, via the processor, a request to apply at least one test on the at least one jewelry item; and receiving, via the processor, a test result that is generated from applying the at least one test on the at least one jewelry item.

B.1. The method of claim B, in which the interactive communication session appears on a monitor screen. B.2. The method of claim B.1., in which the monitor screen splits into at least two sections, in which a first section comprises the online webpage and a second section comprises the interactive communication session with the jewelry consultant. B.3. The method of claim B.1., in which the interactive communication session causes a pop-up box to appear on the monitor screen.

B.4. The method of claim B further comprising: submitting at least search criteria for the at least one jewelry item, in which the at least search criteria is a category. B.5. The method of claim B.4., in which the at least one category comprises at least one of: a price of a diamond, a carat size of a diamond, a cut of a diamond, a color of a diamond, and a clarity of a diamond.

B.6. The method of claim B further comprising: submitting, via a processor, a request to view the at least one jewelry item under a microscope, in which the microscope outputs video images of the at least one jewelry item and is capable of receiving input information from a remote device. B.7. The method of claim B.6. further comprising: receiving, in response to the request to view, live video images of the at least one jewelry item under the microscope. B.8. The method of claim B.6. further comprising: receiving, in response to the request to view, a high-resolution image of the at least one jewelry item under the microscope. B.9. The method of B.6. further comprising: transmitting an instruction directly to the microscope via an input device. B.10. The method of claim B.9., in which the instruction comprises: instructing the microscope to increase a zoom of a lens by a percentage in order to generate a magnified image of the least one jewelry item. B.11. The method of claim B.10. further comprising: receiving the magnified image of the at least one jewelry item over the live video stream. B.12. The method of claim B.9. further comprising: instructing the digital microscope to decrease a zoom of a lens by a percentage to generate a minimized image of the at least one jewelry item. B.13. The method of claim B.12. further comprising: receiving the minimized image of the at least one jewelry item over the live video stream.

B.14. The method of claim B further comprising: submitting a request to customize a setting for the at least one jewelry item. B.15. The method of claim B further comprising: transmitting a request to communicate with a jewelry designer. B.16. The method of claim B further comprising: utilizing an interactive design tool for designing a customized setting, in which the interactive design tool comprises an electronic template of the customized setting and the customized setting comprises a plurality of sections; selecting a first section of the customized setting; receiving at least two customizable options for the first section of the customized setting; selecting one of the at least two customizable options; and receiving a representation of the selected one of the at least two customizable options on the electronic template. B.17. The method of claim B.16., in which selecting the first section of the customized setting further comprises: moving a cursor over the first section of the customized setting.

B.18. The method of claim B.16. further comprising: submitting a request to rotate the customized setting in three dimensions. B.19. The method of claim B.18., in which the request to rotate the customized setting comprises: detecting a selection of a click-and-drag button located on the interactive design tool.

B.20. The method of claim B.16. further comprising: transmitting a request to save the customized setting. B.21. The method of claim B.16. further comprising: transmitting a request to send an electronic link of the customized setting, in which the request comprises an email address for a recipient of the electronic link. B.22. The method of claim B.16. further comprising: transmitting a request to post an electronic link of the customized setting to a social network site, in which at least one individual may vote or comment on the posted customized setting.

B.23. A method comprising: receiving, via a processor, a request from a remote device to communicate with a jewelry consultant concerning at least one jewelry item, in which the processor and the remote device are in electronic communication via a network; and generating, via the processor in response to the request, an interactive communication session between the jewelry consultant and the remote device, in which the interactive communication session transmits live video images of the jewelry consultant and the at least one jewelry item to the remote device. B.24. The method of claim B.23. further comprising: applying, via the processor, at least one test on the at least one jewelry item; and transmitting, via the processor, a test result that is generated from applying the at least one test on the at least one jewelry item.

What is claimed is:

1. The method comprising:
   generating, via at least one processor of at least one computer, an interactive design tool,
      in which the interactive design tool comprises an electronic template of a three-dimensional object comprising a customized setting,
      in which the interactive design tool is configured to customize three-dimensional properties of the customized setting, and
      in which the customized setting comprises a plurality of sections, each section comprising a different portion of the customized setting;
   receiving, via the at least one processor from the remote device, user-input data comprising:
      a selection of a section of the customized setting; and
      a selection of at least one customizable feature of the selected section from among a plurality of possible customizable features, the at least one customizable feature having three-dimensional properties that are different from three-dimensional properties of at least one un-selected customizable feature of the plurality of customizable features;
      in which the remote device and the at least one processor are in electronic communication over a computer network;
   responsive to receiving the selection of the at least one customizable feature, generating, via the at least one processor, a graphical representation of the customized setting,
      in which the customized setting comprises the at least one customizable feature, and
      in which the graphical representation of the customized setting comprises a graphical representation of the at least one customizable feature in the selected section of the customized setting, in which the graphical representation depicts the three-dimensional properties of the at least one customizable feature that are different from three-dimensional properties of at least one un-selected customizable feature of the plurality of customizable features; and
   causing the graphical representation of the customized setting to be displayed at an electronic display device in electronic communication with the at least one processor, the graphical representation of the customized setting being rotatable to depict multiple different perspective views of the customized setting.

2. The method of claim 1 further comprising:
   receiving a selection of a different customizable feature of the selected section; and
   updating the graphical representation of the customized setting, in which the updated graphical representation depicts the different customizable feature in the selected section of the customized setting.

3. The method of claim 1 further comprising:
   receiving a selection of a different section of the customized setting;
   receiving a selection of at least one customizable feature of the different section; and
   automatically updating the graphical representation of the customized setting, in which the updated graphical representation depicts the at least one customizable feature in the different section of the customized setting.

4. The method of claim 1 further comprising:
   receiving a request to rotate the customized setting; and
   receiving a selection of a metal type for at least one of the plurality of sections, the metal type comprising at least one of platinum, yellow gold, white gold, silver, and titanium.

5. The method of claim 4, in which the request to rotate comprises:
   a request to rotate to a side view, further comprising:
   receiving a selection of a shank style for at least one of the plurality of sections.

6. The method of claim 4, in which the request to rotate comprises:
   a request to rotate to a 360 degree view, further comprising:
   receiving a selection of an edge type for at least one of the plurality of sections.

7. The method of claim 4, in which receiving the request to rotate comprises:
   detecting a click and drag of a mouse.

8. The method of claim 1 further comprising:
detecting a cursor over the selected section of the customized setting; and
receiving a selection of at least one of a number of prongs and a style of prongs, the style of prongs comprising one of all-around mount, cathedral mount, claw mount, illusion mount, split mount, and tension mount.

9. The method of claim 1 further comprising:
receiving a request to save the customized setting;
storing the customized setting in a database; and
receiving a selection of one of (1) a type of side stone setting comprising at least one of pave setting, channel setting, baguette setting, and three stone setting, and (2) a type of side stone cut comprising at least one of Asscher cut, baguillion cut, barocut, briolette cut, corona cut, crosscut cut, cushion cut, Czar cut, flanders square cut, grace cut, half moon cut, heart-shaped cut, Marquise cut, radiant cut, oval cut, prear-shaped cut, princess cut, quadrillion cut, regent cut, trillion cut, virtue cut, and round cut.

10. The method of claim 1 further comprising:
receiving a request to print the customized setting, in which the customized setting comprises a customized ring setting.

11. The method of claim 1 further comprising:
receiving a request to transmit the customized setting to a remote device, in which the customized setting comprises a customized ring setting.

12. The method of claim 11 further comprising:
in response to the request to transmit the customized setting, transmitting an electronic link of the customized setting, in which the customized setting comprises a customized ring setting.

13. The method of claim 1 further comprising:
receiving a request to post the customized setting on a social media, in which the customized setting comprises a customized ring setting; and
receiving a selection of at least one of a shape and size of the customized setting.

14. The method of claim 13 further comprising:
in response to the request to post the customized setting, posting an electronic link of the selected ring setting to a social network site, in which the customized setting comprises a customized ring setting.

15. The method of claim 14, in which at least one individual may vote or comment on the posted selected ring setting.

16. The method of claim 1,
in which the customized setting comprises a customized setting of a diamond, and in which the jewelry item is a diamond, and
in which the certificate rating the diamond is viewable online.

17. The method of claim 1 further comprising:
receiving a request for a physical model of the customized setting.

18. The method of claim 17 further comprising:
in response to the request for the model of the customized setting, generating an image of the customized setting.

19. The method of claim 1 further comprising:
receiving a request for a meeting with a design consultant.

20. The method of claim 19 further comprising:
in response to the request for the meeting with the design consultant, generating a video session with the design consultant, the video session comprising real-time communication with the design consultant.

21. The method of claim 1 further comprising:
receiving an uploaded image of a setting design.

22. An apparatus comprising:
at least one processor of at least one computer in electronic communication with at least one remote device; and
at least one memory, in which the at least one memory stores instructions which, when executed by the at least one processor, direct the at least one processor to:
generate an interactive design tool, in which the interactive design tool comprises an electronic template of a three-dimensional object comprising a customized setting,
in which the interactive design tool is configured to customize three-dimensional properties of the customized setting, and
in which the customized setting comprises a plurality of sections, each section comprising a different portion of the customized setting;
receive from the remote device user-input data comprising:
a selection of a section of the customized setting; and
a selection of at least one customizable feature of the selected section from among a plurality of possible customizable features, the at least one customizable feature having three-dimensional properties that are different from three-dimensional properties of at least one un-selected customizable feature of the plurality of customizable features;
responsive to receiving the selection of the at least one customizable feature, generate a graphical representation of the customized setting,
in which the customized setting comprises the at least one customizable feature, and
in which the graphical representation of the customized setting comprises a graphical representation of the at least one customizable feature in the selected section of the customized setting, in which the graphical representation depicts the three-dimensional properties of the at least one customizable feature that are different from three-dimensional properties of at least one un-selected customizable feature of the plurality of customizable features; and
causing the graphical representation of the customized setting to be displayed at an electronic display device in electronic communication with the at least one processor, the graphical representation of the customized setting being rotatable to depict multiple different perspective views of the customized setting.

23. An article of manufacture comprising:
a computer-readable medium that is non-transitory, in which the computer-readable medium stores instructions which, when executed by at least one processor of at least one computer, direct the at least one processor to:
generate an interactive design tool,
in which the interactive design tool comprises an electronic template of a three-dimensional object comprising a customized setting,
in which the interactive design tool is configured to customize three-dimensional properties of the customized setting, and
in which the customized setting comprises a plurality of sections, each section comprising a different portion of the customized setting;

receive user-input data comprising:
- a selection of a section of the customized setting; and
- a selection of at least one customizable feature of the selected section from among a plurality of possible customizable features, the at least one customizable feature having three-dimensional properties that are different from three-dimensional properties of at least one un-selected customizable feature of the plurality of customizable features;

responsive to receiving the selection of the at least one customizable feature, generate a graphical representation of the customized setting,
- in which the customized setting comprises the at least one customizable feature,
- in which the graphical representation of the customized setting comprises a graphical representation of the at least one customizable feature in the selected section of the customized setting, in which the graphical representation depicts the three-dimensional properties of the at least one customizable feature that are different from three-dimensional properties of at least one un-selected customizable feature of the plurality of customizable features; and causing the graphical representation of the customized setting to be displayed an electronic display device in electronic communication with the at least one processor, the graphical representation of the customized setting being rotatable to depict multiple different perspective views of the customized setting.

* * * * *